United States Patent [19]

Maydan et al.

[11] Patent Number: 5,746,875
[45] Date of Patent: May 5, 1998

[54] GAS INJECTION SLIT NOZZLE FOR A PLASMA PROCESS REACTOR

[75] Inventors: Dan Maydan, Los Altos Hills; Steve S. Y. Mak, Pleasanton; Donald Olgado, Mountain View; Gerald Zheyao Yin, Sunnyvale, all of Calif.; Timothy D. Driscoll, Hamilton, Mont.; James S. Papanu, San Rafael; Avi Tepman, Cupertino, both of Calif.

[73] Assignee: Applied Materials, Inc., Santa Clara, Calif.

[21] Appl. No.: 551,881

[22] Filed: Oct. 16, 1995

Related U.S. Application Data

[63] Continuation-in-part of Ser. No. 307,888, Sep. 16, 1994, Pat. No. 5,643,394.
[51] Int. Cl.$^6$ ........................................ H05H 1/00
[52] U.S. Cl. .................. 156/345; 118/723 E; 118/723 R
[58] Field of Search ........................ 156/345; 118/723 E, 118/723 R; 204/298.31, 298.33, 298.07

[56] References Cited

U.S. PATENT DOCUMENTS

| | | | |
|---|---|---|---|
| 4,512,283 | 4/1985 | Bonifield et al. | 156/345 X |
| 4,612,077 | 9/1986 | Tracy et al. | 156/345 |
| 5,000,113 | 3/1991 | Wang et al. | 156/345 X |
| 5,074,456 | 12/1991 | Degner et al. | 156/345 X |
| 5,356,515 | 10/1994 | Tahara et al. | 156/345 X |
| 5,376,213 | 12/1994 | Ueda et al. | 156/345 |
| 5,500,256 | 3/1996 | Watabe | 118/723 E X |

FOREIGN PATENT DOCUMENTS

| | | |
|---|---|---|
| A-0 090 586 | 10/1983 | European Pat. Off. |
| 0 550 058 A | 7/1993 | European Pat. Off. |
| A-0 552 491 | 7/1993 | European Pat. Off. |
| 0 634 575 A | 1/1995 | European Pat. Off. |
| 62-123721 | 6/1987 | Japan |
| 02-294029 | 12/1990 | Japan |
| 03-188627 | 8/1991 | Japan |

*Primary Examiner*—Thi Dang
*Attorney, Agent, or Firm*—Michaelson & Wallace

[57] ABSTRACT

The invention is embodied in a gas injection apparatus for injecting gases into a plasma reactor vacuum chamber having a chamber housing, a pedestal holding a workpiece to be processed, a device for applying RF energy into the chamber, the gas injection apparatus having a gas supply containing an etchant species in a gas, an opening in the chamber housing, a gas distribution apparatus disposed within the opening in the chamber housing which has at least one slotted aperture facing the interior of the chamber and a device for controlling the flow rate of gas from the one or more slotted apertures, and a gas feed line from the supply to the gas distribution apparatus. In a preferred embodiment, the gas distribution apparatus includes a center member surrounded by at least one annular member with a gap therebetween comprising the slotted aperture. Preferably, each of the members of the gas distribution apparatus comprises a material at least nearly impervious to attack from the etchant species. In one example, each of the members of the gas distribution apparatus comprises one of a ceramic, fused quartz, polymeric or anodized aluminum material and the gas feed line comprises stainless steel. Preferably, each of the members has its surface polished prior to assembly of the gas distribution apparatus.

18 Claims, 16 Drawing Sheets

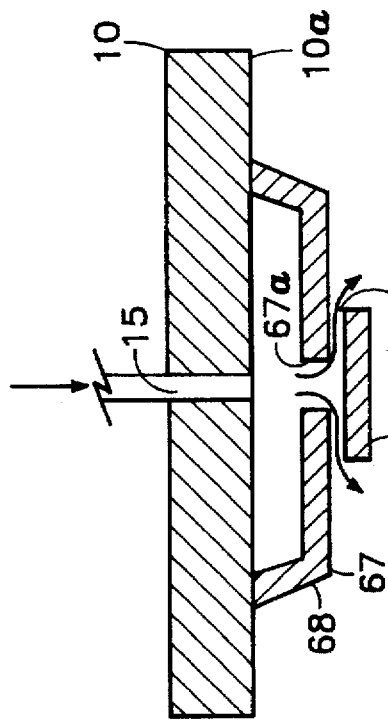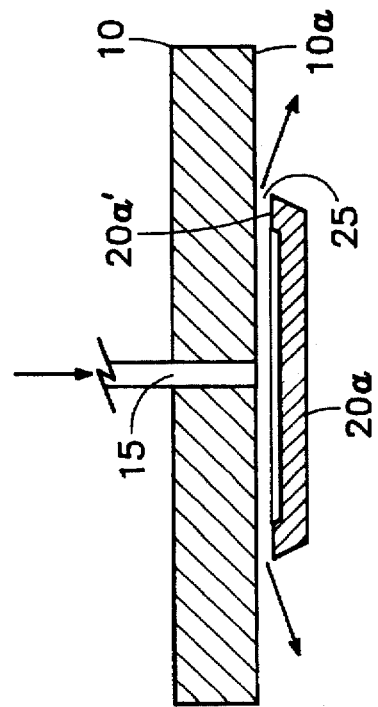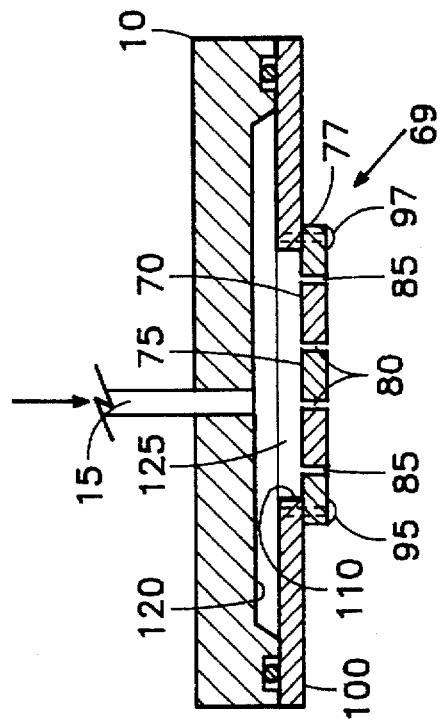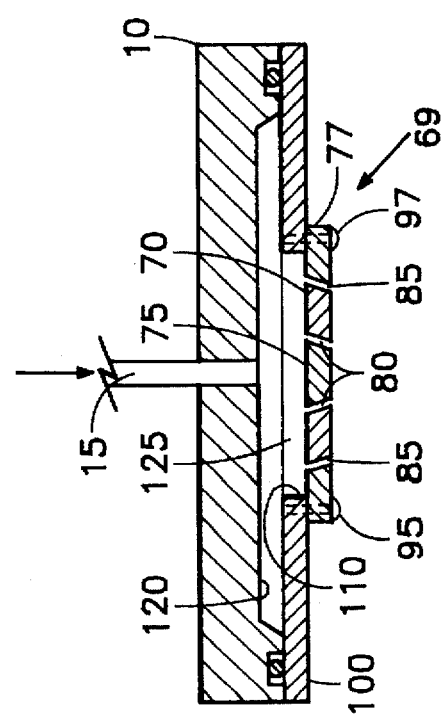

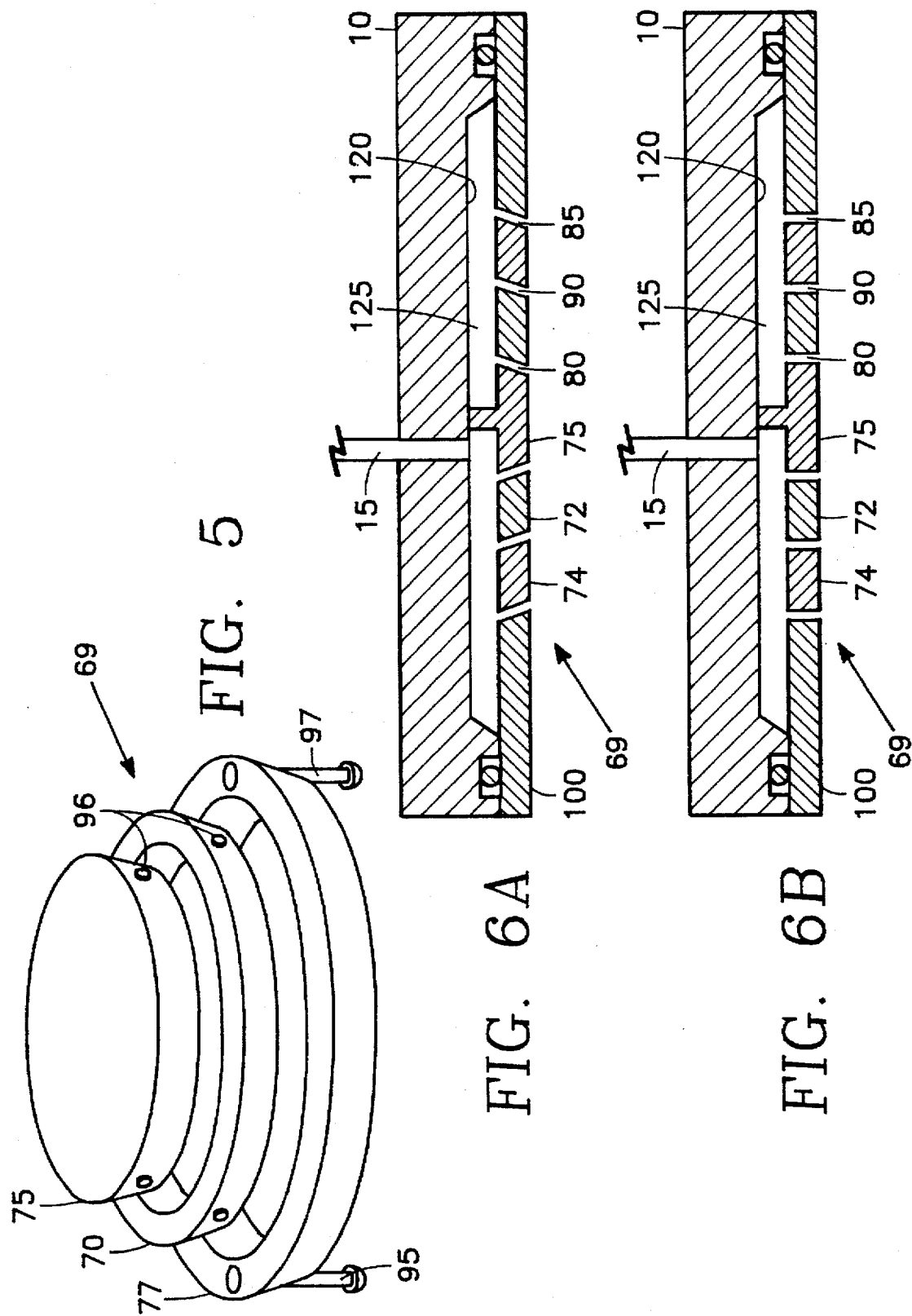

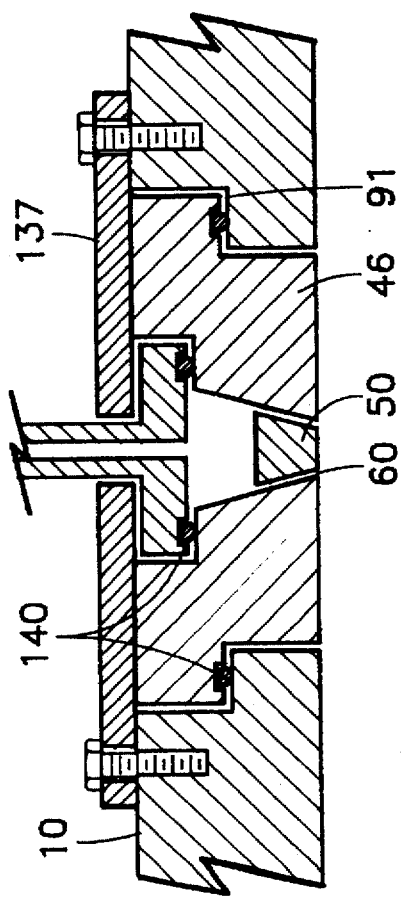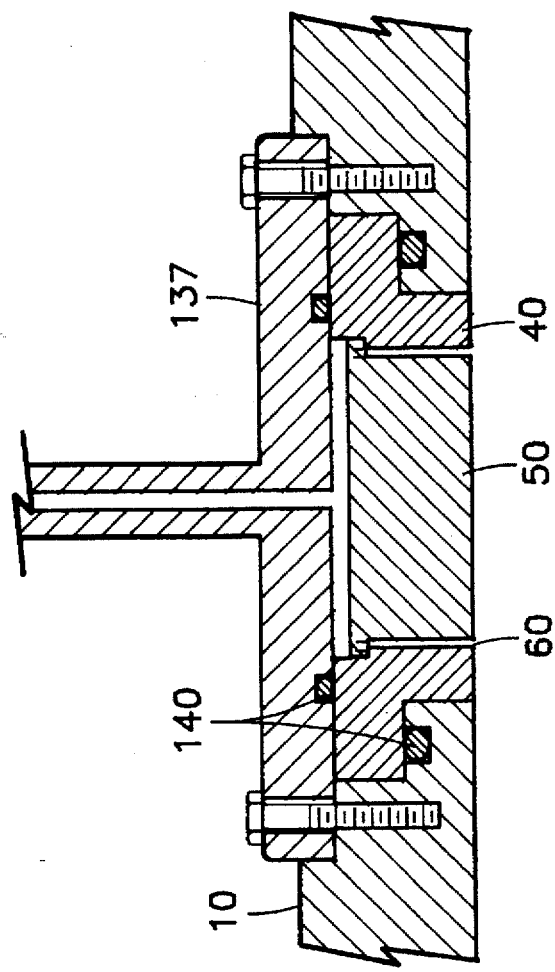

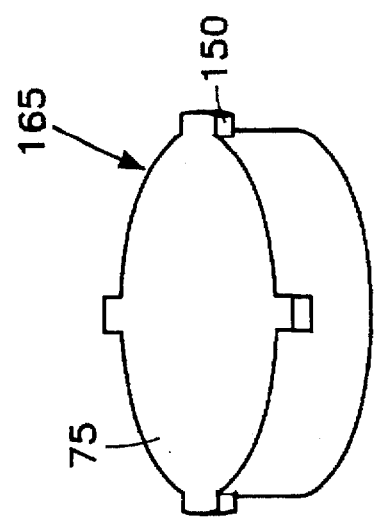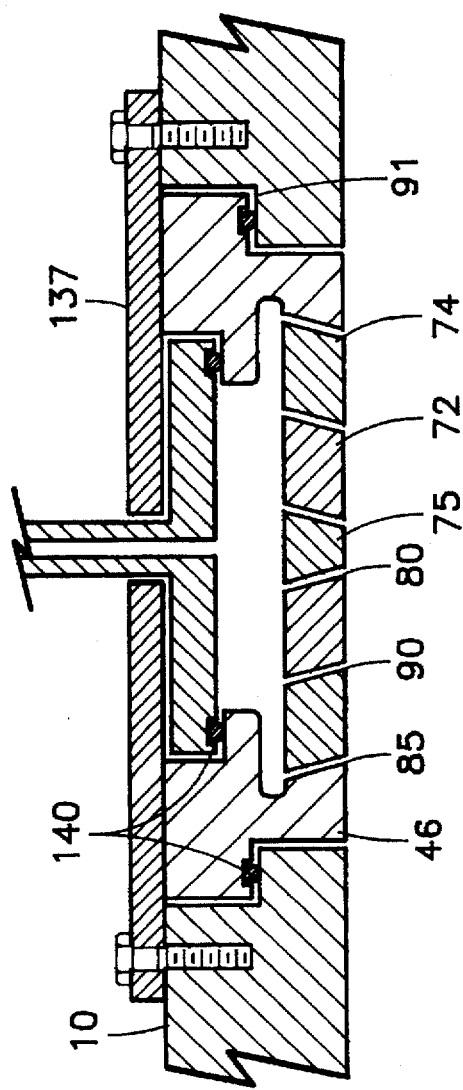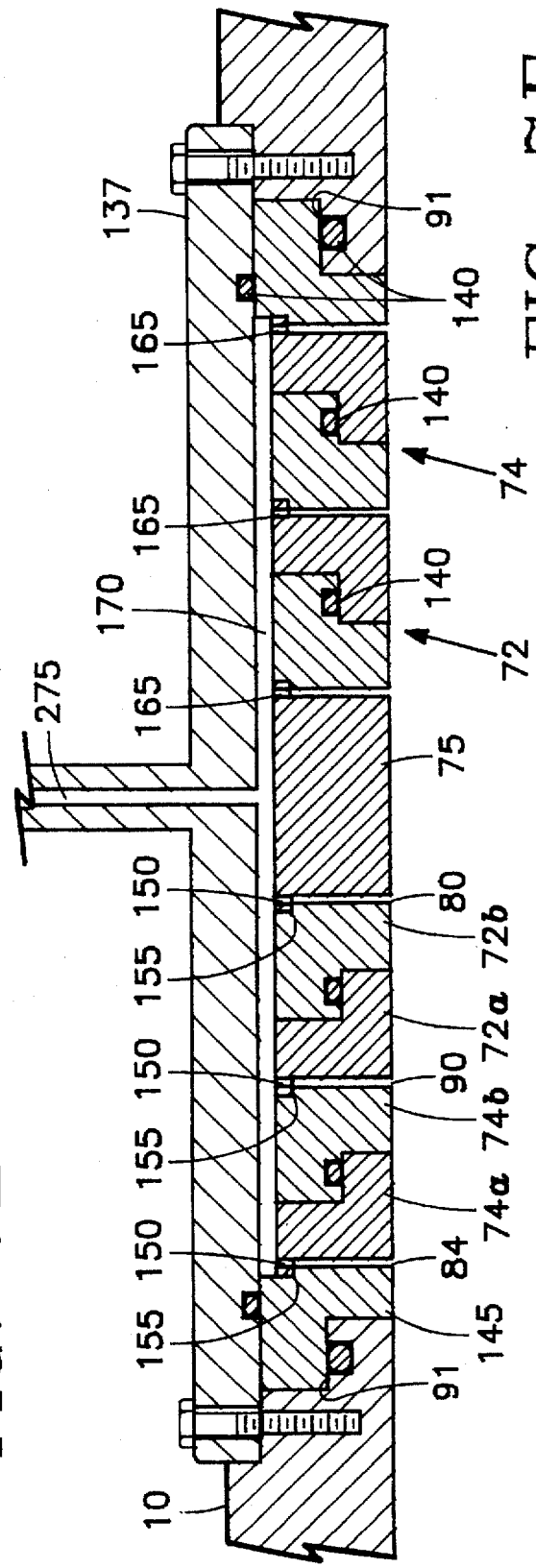

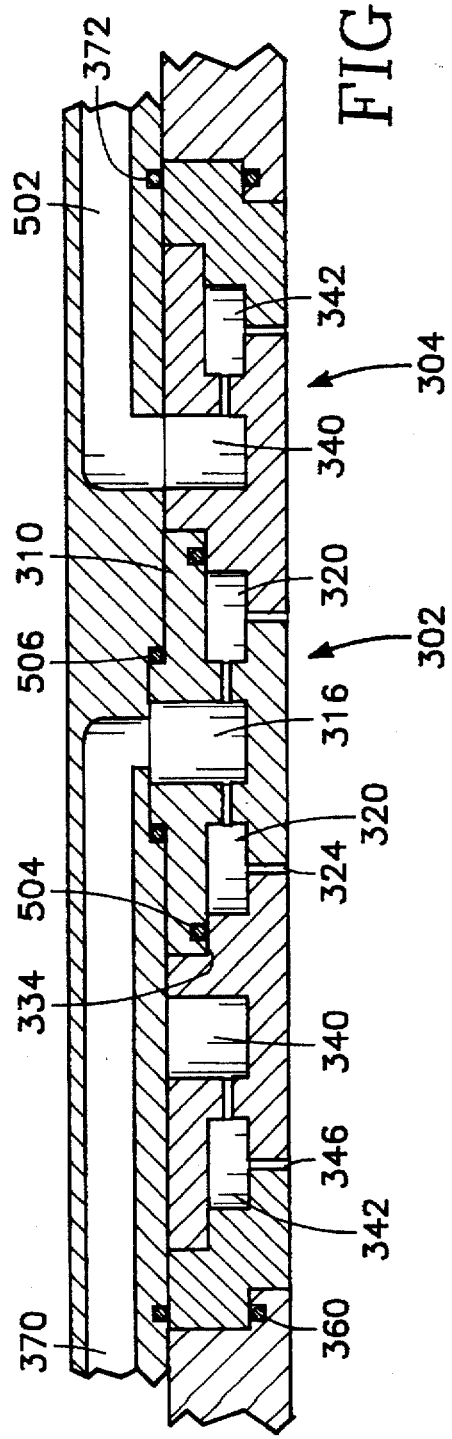
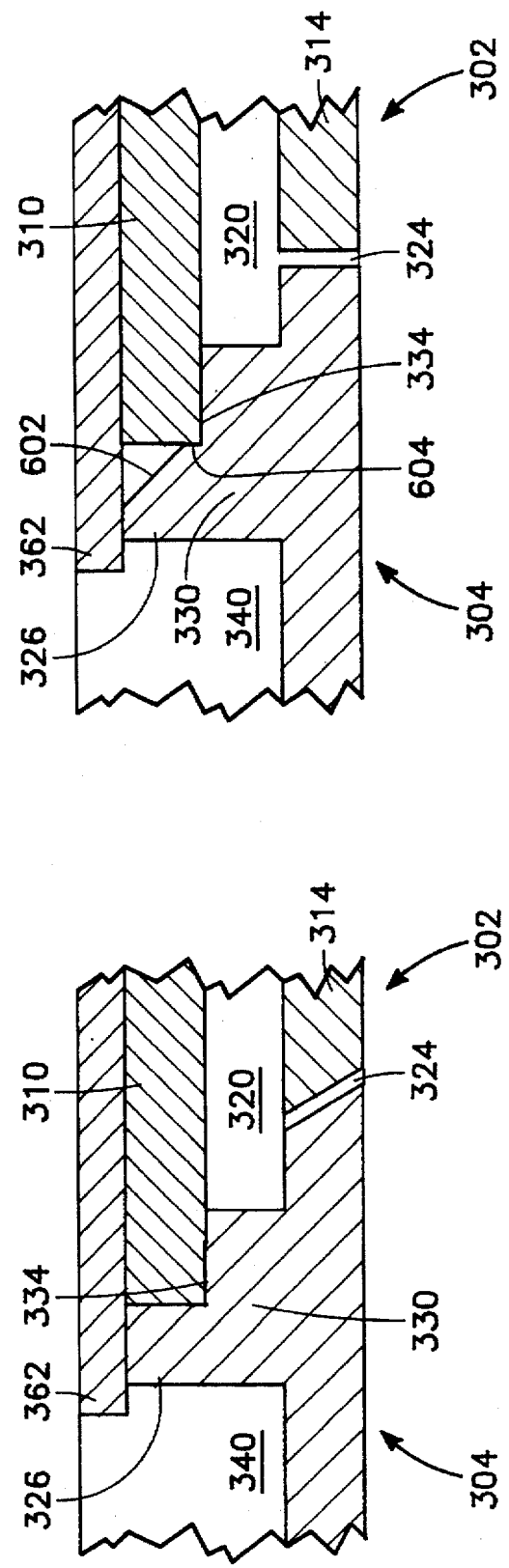
FIG. 20
FIG. 21
FIG. 22

GAS INJECTION SLIT NOZZLE FOR A PLASMA PROCESS REACTOR

This is a continuation-in-part of application Ser. No. 08/307,888, filed Sep. 16, 1994, now U.S. Pat. No. 5,643,394.

BACKGROUND OF THE INVENTION

1. Technical Field

The invention is related to plasma reactors for processing semiconductor integrated circuit wafers and specifically to improvements in the gas injection and distribution apparatus employed in such reactors.

2. Background Art

A plasma reactor for processing semiconductor integrated circuit wafers, such as a metal etch reactor, typically includes a vacuum chamber, a pedestal for supporting the wafer in the chamber, a plasma RF power source and a gas injection source for supplying gases through the top of the chamber and a gas distribution plate near the chamber ceiling for distributing the incoming gases in a uniform manner. If the reactor is an inductively coupled reactor, then it can include a coil antenna around the chamber connected to the plasma RF power source, and the wafer pedestal can be connected to a bias RF power source. In other types of plasma reactors (such as, for example, a reactive ion etch reactor), there is no coil antenna and the plasma RF power source is connected to the wafer pedestal. For plasma etch processes, the incoming gas includes an etchant species such as chlorine and/or boron tri-chloride, for example. The gas distribution plate is typically a flat plate covering the reactor chamber ceiling about 100–150 mils thick with about one hundred holes or orifices therethrough, each hole being no more than about 20–30 mils in diameter in order to prevent penetration of the plasma into the holes. The backside or top surface of the gas distribution plate is coupled to a gas injection source or port which extends through the chamber top or lid while the front side faces downwardly toward the chamber interior and the wafer.

The gas distribution plate must be fairly large to provide a reasonably uniform gas distribution within the chamber and to provide a means of controlling the electrical potential at the top of the reactor chamber. Typically, the gas distribution plate is a ground plane. For this purpose, the gas distribution plate must be made of a conductive material such as aluminum.

The basic problem with such a gas distribution plate is that it is subject to corrosion from the gases introduced through it into the reactor chamber. The gas distribution plate front surface is directly exposed to the plasma within the chamber and is therefore susceptible to attack therefrom. The gas distribution plate back surface is coupled to the gas supply inlet and the gases contacting the back surface are at a relatively high pressure due to the back pressure caused by the small size of the orifices or holes through the gas distribution plate. This high back pressure increases the rate at which the gas distribution plate back surface is corroded. In order to minimize such corrosion, the gas distribution plate is anodized to provide an aluminum oxide film on its surface. Unfortunately, in etch reactors employing mixtures of chlorine and boron tri-chloride gases, the boron tri-chloride etches the anodized surface (the aluminum oxide film) while the chlorine etches the aluminum underneath to undermine the aluminum oxide film.

Such problems are particularly acute at the orifices or holes through the gas distribution plate. In order to prevent a plasma glow from forming in the holes and behind the plate, the diameters of these holes cannot exceed the plasma sheath thickness, which is approximately 20–30 mils. Such small holes must be either drilled mechanically or by a laser, either of which forms a hole with sharp edges and roughens the interior surface of each hole. The sharp edges around each hole and the rough interior surfaces of each hole are eroded by the flow of chlorine and tri-chloride gases. If the gas distribution plate is anodized, cracks in the anodization are difficult to avoid at the sharp edges of the holes. At these edges, the anodization is susceptible to erosion due to gas flow and corrosion due to penetration of etchant gases into the anodization cracks and etching of the underlying aluminum. All such erosion and corrosion creates particle contamination which can lead to fatal defects in the integrated circuits on the wafer being processed in the chamber. In an effort to reduce such problems, the gas distribution plate hole edges may be routed and the hole interior surfaces and edges may be honed with a diamond powder. However, such efforts merely reduce the magnitude of the problem but do not solve the problem.

In view of the foregoing problems, one limitation of such plasma reactors has been that the gas distribution plate typically can only be used for two complete process cycles of the reactor, a new gas distribution plate being required thereafter. (The term "process cycle" as used herein refers to the time between successive chamber cleaning operations.) This avoids many of the foregoing problems but greatly increases the unproductive "down" time and capital costs or expenditures incurred while operating such a plasma reactor.

Furthermore, enhanced corrosion of the top or lid behind (or above) the gas distribution plate is often observed.

Another problem with such reactors, particularly etch reactors, is that the etch rate near the wafer periphery is much greater than the etch rate near the wafer center. This is due at least in part to the fact that the etchant species are being consumed at a maximum rate near the wafer and may therefore be scarce in the region near the wafer center, while little or no consumption of etchant species occurs beyond the edge of the wafer so that a plentiful supply of etchant species exists just beyond the wafer periphery capable of sustaining very high etch rates near the wafer periphery. The etch rate across the wafer diameter may be rendered less non-uniform by providing for a greater gas flow through the gas distribution plate over the wafer center and a lesser gas flow over the wafer periphery. This is accomplished by providing more orifices or holes per unit area in the gas distribution plate over the wafer center and less over the wafer periphery. Etch rate nonuniformity across the wafer diameter to within 5 percent has been achieved, and is satisfactory.

One technique for further enhancing the uniformity of the etch rate across the wafer diameter is to provide a so-called focus ring, which may be an annular vertical high wall up to several centimeters in height surrounding the wafer periphery. This wall or focus ring stops or retards the replenishment of etchant species at the wafer periphery.

SUMMARY

The invention is provided in a gas injection apparatus for injecting gases into a plasma reactor vacuum chamber having a chamber housing, a pedestal holding a workpiece to be processed, a device for applying RF energy into the chamber, the gas injection apparatus having a gas supply containing an etchant species in a gas, an opening in the chamber housing, a gas distribution apparatus disposed within the opening in the chamber housing which has at least one slotted aperture facing the interior of the chamber and a device for controlling the flow rate of gas from the one or more slotted apertures, and a gas feed line from the supply to the gas distribution apparatus. In a preferred embodiment, the gas distribution apparatus includes a center member surrounded by at least one annular member with a gap therebetween comprising the slotted aperture. Preferably, each of the members of the gas distribution apparatus comprises a material at least nearly impervious to attack from the etchant species. In one example, each of the members of the gas distribution apparatus comprises one of a ceramic, fused quartz, polymeric, or anodized aluminum material and the gas feed line comprises stainless steel. Preferably, each of the members has its surface polished prior to assembly of the gas distribution apparatus.

BRIEF DESCRIPTION OF THE DRAWINGS

FIG. 2 is a cross-sectional view of the ceiling of a plasma reactor including a fourth embodiment of a gas distribution slotted nozzle of the present invention.

FIG. 3 is a cross-sectional view of the ceiling of a plasma reactor including a fifth embodiment of a gas distribution slotted nozzle of the present invention.

FIG. 4A is a cross-sectional view of the ceiling of a plasma reactor including a sixth embodiment of a gas distribution slotted nozzle of the present invention.

FIG. 4B is a cross-sectional view of an embodiment corresponding to FIG. 4A but having vertical slotted nozzles.

FIG. 5 is a perspective exploded view of a portion of the gas distribution slotted nozzle of FIG. 4A.

FIG. 6A is a cross-sectional view of the ceiling of a plasma reactor including a seventh embodiment of a gas distribution slotted nozzle of the present invention.

FIG. 6B is cross-sectional view of an embodiment corresponding to FIG. 6A but having vertical slotted apertures.

FIG. 7A is an enlarged cross-sectional view of a top-inserted version of a single slot "in-lid" embodiment of the invention corresponding to FIG. 1C.

FIG. 7B is an enlarged cross-sectional view of a top-inserted version of a single slot "in-lid" embodiment of the invention corresponding to FIG. 1D.

FIG. 7E is a cross-sectional view of a three-slit version of the embodiment of FIG. 7C.

FIG. 7F is a cross-sectional view of a three-slit version of the embodiment of FIG. 7D.

FIG. 7G is a perspective view of a central disk of the blocking plate assembly in the embodiment of FIG. 7D.

FIG. 20 is a cross-sectional view of an alternate version of the two-slot embodiment of FIGS. 16A-B in which the central and annular cavities are supplied with gas separately.

FIG. 21 is a cross-sectional view of a portion of the gas distribution apparatus according to one version of the embodiments of FIGS. 16A-B, 17, or 18, incorporating an angled slotted aperture.

FIG. 22 is a cross-sectional view of a portion of the gas distribution apparatus according to one version of the embodiments of FIGS. 16A-B, 17, or 18, incorporating a chamfered edge to facilitate assembly.

DETAILED DESCRIPTION OF THE PREFERRED EMBODIMENTS

Figure 1A:
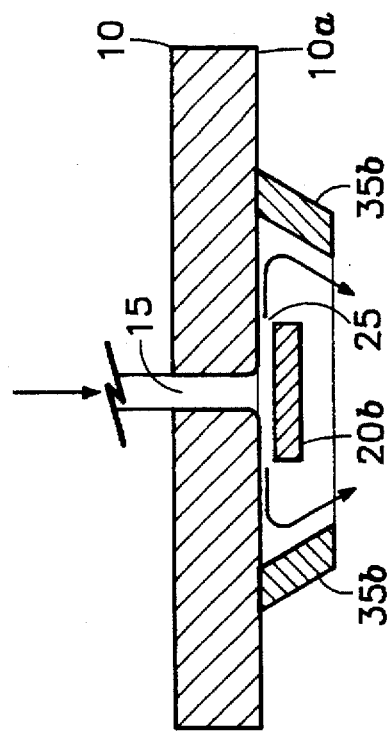
FIG. 1A is a cross-sectional view of the ceiling of a plasma reactor including a first embodiment of a gas distribution slotted nozzle of the present invention.

The invention replaces the conventional flat gas distribution plate (i.e., a showerhead or perforated plate) having plural gas injection orifices therethrough near the chamber ceiling. The invention is a gas distribution apparatus in or on the chamber lid or ceiling. In a first embodiment of the invention illustrated in FIG. 1A, the reactor chamber top wall or lid 10 has a gas injection passage 15 therethrough. A disk-shaped blocking plate 20a suspended and spaced from the lid 10 forms a circular slotted aperture or slit nozzle 25 between a circular ridge 20a' of the blocking plate 20a and the ceiling surface 10a of the chamber lid 10. In general, the blocking plate 20a is a solid symmetrical element having its axis of symmetry approximately centered with respect to the injection passage 15 so as to uniformly disperse the gas flowing from the injection passage 15. The blocking plate 20a is sufficiently close to the lid 10 so that the aperture 25 is a long thin and preferably continuous opening. A symmetrical annular reflector 35a attached to the ceiling surface 10a is centered relative to and surrounds the plate 20a so as to focus the gas injected through the circular aperture 25 toward the center of the chamber in order to enhance the etch rate near the wafer center.

Figure 1B:
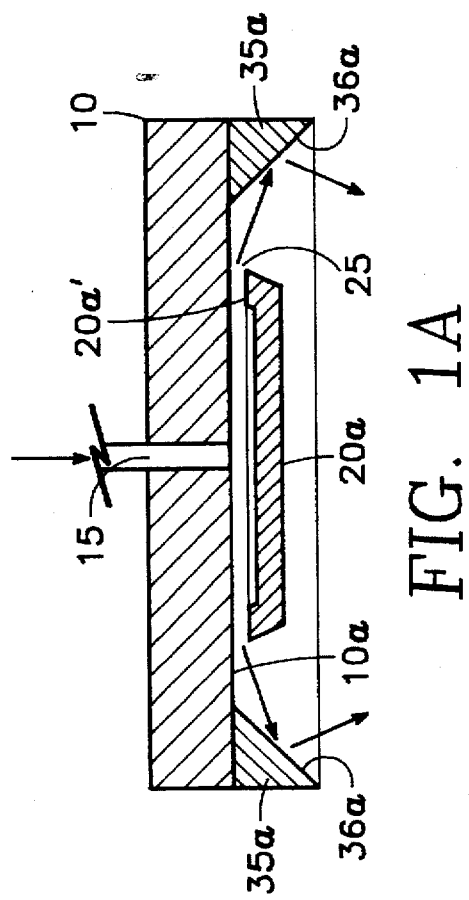
FIG. 1B is a cross-sectional view of the ceiling of a plasma reactor including a second embodiment of a gas distribution slotted nozzle of the present invention.

In a second embodiment illustrated in FIG. 1B, the size of the entire gas injection apparatus is reduced by employing the disk-shaped blocking plate 20b of reduced diameter and employing the annular reflector 35b of reduced diameter. In the embodiment of FIG. 1A, the annular reflector 35a has an inner surface 36a disposed at an obtuse angle relative to the blocking plate 20a, while in the embodiment of FIG. 1B the annular reflector 35b has an inner surface 36b disposed at an acute angle relative to the blocking plate 20 for greater focusing of the injected gases toward the wafer center. In the embodiments of FIGS. 1A and 1B, the gas injection port 15 is centered with respect to the chamber and lid 10.

Figure 1C:
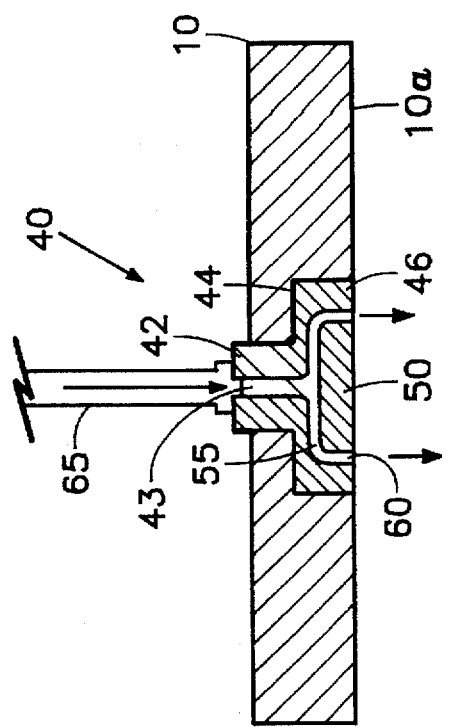
FIG. 1C is a cross-sectional view of the ceiling of a plasma reactor including a third embodiment of a gas distribution slotted nozzle of the present invention.

A third embodiment of the invention is illustrated in FIG. 1C. In this embodiment, the entire gas injection apparatus is contained within the lid 10 and consists of a gas passage liner 40 including a cylindrical upper liner 42 forming a cylindrical top passage 43, an annular intermediate liner 44 extending radially outwardly from the base of the cylindrical upper liner 42, and an inverted truncated conical annular bottom liner 46 extending from the edge periphery of the annular intermediate liner 44 to the ceiling surface 10a of the lid 10. An inverted truncated conical center disk 50 is fastened in place in the interior space surrounded by the bottom liner 46 and is congruent therewith. The disk 50 is spaced from the intermediate liner 44 to form a horizontal flat disk-shaped gas manifold 55. Furthermore, the disk 50 is spaced from the bottom liner 46 to form a conical annular shaped slotted aperture 60 which serves as the gas injection nozzle. The conical angle at which the slotted aperture 60 is disposed does not necessarily have to be the angle depicted in FIG. 1C. It is selected to provide an optimum uniform distribution of etch rate across the wafer surface. For example, the angle can be selected to bias the gas distribution toward the center of the wafer to compensate for the usual tendency of plasma etch processes to have a lower etch rate at the center of the wafer. Overall, process conditions and hardware parameters in addition to the nozzle design impact etch rate uniformity, so the slotted aperture 60 can be vertical (as in the embodiment of FIG. 1D referenced below) or angled inwardly or angled outwardly with respect to its central axis.

Figure 1D:
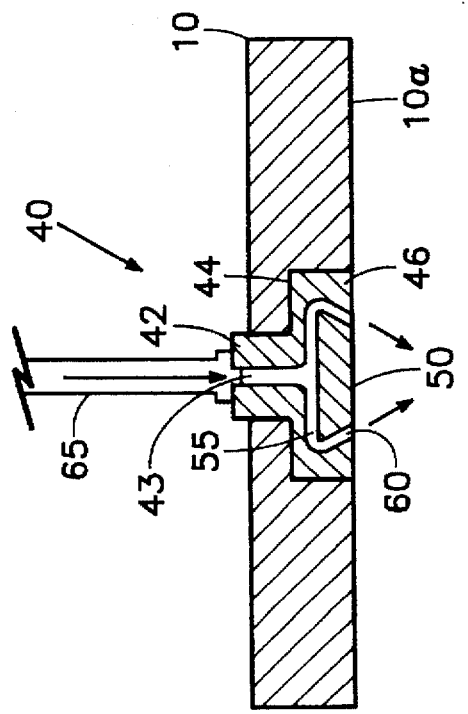
FIG. 1D is a cross-sectional view of an embodiment corresponding to FIG. 1C but having a vertical slotted nozzle.

FIG. 1D illustrates a fourth embodiment, which is identical to the embodiment of FIG. 1C except that the slotted aperture is vertical and the annular bottom liner 46 and center disk 50 are cylindrical rather than conical. FIG. 1D is a preferred embodiment.

An advantage of the invention is that the interior surfaces of the nozzle passages, including the interior surfaces of the manifold 55 and the interior surface of the slotted aperture or nozzle 60, are free of surface defects and therefore are not subject to corrosion or erosion. This is because the liner 40, including its constituent elements 42, 44, 46, and the center disk 50 are manufactured and machined as separate pieces prior to assembly of the gas distribution apparatus. Thus, the interior surfaces are, during manufacturing, exterior surfaces of the separate pieces 40 (including 42, 44, 46) and 50.

Accordingly, external polishing procedures are employed to achieve a defect-free smooth surface on each piece. This solves one aspect of the problem of contamination from erosion or corrosion of gas passage internal surfaces.

Another advantage of the invention is the small size or diameter of the gas distribution apparatus relative to the wafer diameter, particularly in the case of the preferred embodiment of FIG. 1D. Because of its small radial extent, the gas distribution apparatus, including the liner 40 and the center disk 50, need not be formed of a conductor material. As long as the lid 10 is a conductor, it is not necessary that the small gas distribution apparatus of FIG. 1D be a conductor to provide a ground plane at the top of the chamber. Therefore, it is preferable that the gas distribution apparatus including the liner 40 and the center disk 50 be formed of a material impervious to attack by the plasma or etchant species in the gas injected into the plasma. A preferred material is ceramic, such as alumina, sapphire, aluminum nitride, silicon nitride, or various glass-ceramic materials. However, fused quartz (or any suitable vitreous silica), and polymeric materials such as polyimide and polyetherimide, could be employed as well. As a result, the gases to be injected (such as chlorine or boron tri-chloride in the case of an etch reactor) never contact aluminum on their way into the reactor chamber. Specifically, the gas feed line 65 to the cylindrical injection passage 43 is stainless steel, so that the injected gases contact either the steel material of the gas feed line 65 or the aforementioned ceramic, fused quartz, or polymeric material of the liner 40 and center disk 50. The foregoing features, including the external polishing of the liner 40 and center disk 50 surfaces and the use of materials such as the aforementioned ceramic, fused quartz, or polymeric material, eliminate the problem of contamination due to corrosion and erosion of gas distribution materials.

FIG. 2 illustrates an embodiment corresponding to FIG. 1A, but without the reflector 35a. The embodiment of FIG. 2 was found to provide a deviation in metal etch rate nonuniformity across a 200 mm diameter wafer surface not exceeding about 20%, where the percent of nonuniformity (N) is defined as:

$$N = [(Rmax - Rmin)/(2 \times Ravg)] \tag{1}$$

Rmax being the maximum etch rate, Rmin being the minimum etch rate, and Ravg being the average etch rate across the surface of the wafer.

FIG. 3 illustrates a modification of the embodiment of FIG. 2 in which a disk-shaped injection manifold floor 67 having a center gas outlet 67a therethrough is attached to the bottom of the lid 10 by a truncated conical annulus 68. The blocking plate 20b (from FIG. 1B) faces the bottom of the gas outlet so as to uniformly disperse gases emanating from the gas outlet 67. The embodiment of FIG. 3 was found to provide a deviation in metal etch nonuniformity across the wafer surface not exceeding about 9%.

FIG. 4A illustrates another preferred embodiment of the invention having a blocking plate assembly 69 consisting of a parallelogramic annulus 70 and a smaller truncated conical center disk 75 (similar to the center disk 50 of FIG. 1C) within the annulus 70, and an outer annulus 77, forming two concentric circular slotted inwardly-angled apertures or nozzles 80, 85. FIG. 4B illustrates a modification to the embodiment of FIG. 4A in which the slotted apertures 80, 85 are vertical and the disk and annuli 75, 70, 77 are cylindrical. FIG. 5 illustrates the blocking plate assembly 69 of FIG. 4A prior to assembly at a point at which all of the interior gas nozzle passages are exterior surfaces of the separate pieces 70, 75, 77, which are polished separately for defect-free surfaces. The separate pieces 70, 75, 77 may be held together by radial spokes 96, the outer piece 77 being fastened by bolts 95, 97 to the lid 10, as will now be described. For this purpose, an injection manifold floor 100 is attached to the lid 10 about an opening 110 through the lid providing access to the passages 80, 85. A recessed ceiling 120 in the lid 10 and the injection manifold floor 100 form a gas injection manifold 125 over the passages 80, 85. The bolts 95, 97 are screwed into threaded holes in the floor 100.

FIG. 6A illustrates an expansion of the concept of FIG. 4A in which the blocking plate assembly 69 is modified to include a pair of concentric parallelogramic annuli 72, 74, providing three circular slotted apertures or nozzles 80, 85, 90 angled inwardly toward the center. In this embodiment, all of the pieces are co-planar with the floor 100. FIG. 6B illustrates an embodiment corresponding to FIG. 6A but having vertical slotted apertures 80, 85, 90.

FIG. 7A is an enlarged view of an embodiment which, like that of FIG. 1C, has a single slotted aperture 60, and is contained entirely within the lid 10, thereby eliminating any need for an attached floor (such as the floor 100 of FIG. 4A) and presenting a flush surface toward the interior of the reactor chamber, a significant advantage. The embodiment of FIG. 7A is a modular self-aligning assembly and requires fewer parts. Each element of the assembly is polished prior to assembly. Also, the liner element 46 is supported by a ledge 91 machined around an opening through the lid 10, which allows installation without removing the lid 10, makes sealing easier, and can more easily accommodate the pressure differential between ambient and the vacuum chamber. Furthermore, the embodiment of FIG. 7A requires no fasteners on the chamber side of the sealing surfaces. A significant advantage is that the modular construction of the gas distribution apparatus of FIG. 7A requires no drilling of gas passage holes, even though it succeeds in providing gas flow nozzles or slotted apertures with a width less than the plasma sheath thickness. In the absence of any necessity of drilling small holes, materials such as fused quartz or sapphire, or the like, may be employed, if desired. Such materials are highly suitable in corrosive gas environments.

FIG. 7A shows how the gas distribution apparatus is bolted with an exterior mounting ring 137 to the lid 10 and how O-ring seals 140 are employed to block gas flow along undesirable paths. The slotted aperture 60 is between about 20–30 mils wide. FIG. 7B is an enlarged view of one implementation of the embodiment of FIG. 7A, having a vertical gas exit flow (slotted aperture 60). FIG. 7B is also a preferred embodiment.

Figure 7C:
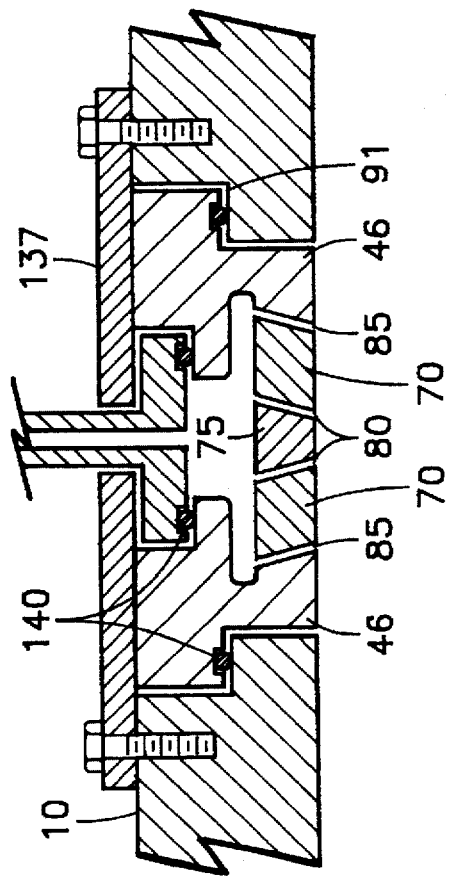
FIG. 7C is a cross-sectional view of a two-slit version of the embodiment of FIG. 7A.

FIG. 7C is a cross-sectional view of a two-slit version of the embodiment of FIG. 7A and employs the truncated conical center disk 75 and truncated conical annulus 70 of FIG. 4A to form the two slotted apertures 80, 85 extending at an angle relative to the axis of symmetry.

Figure 7D:
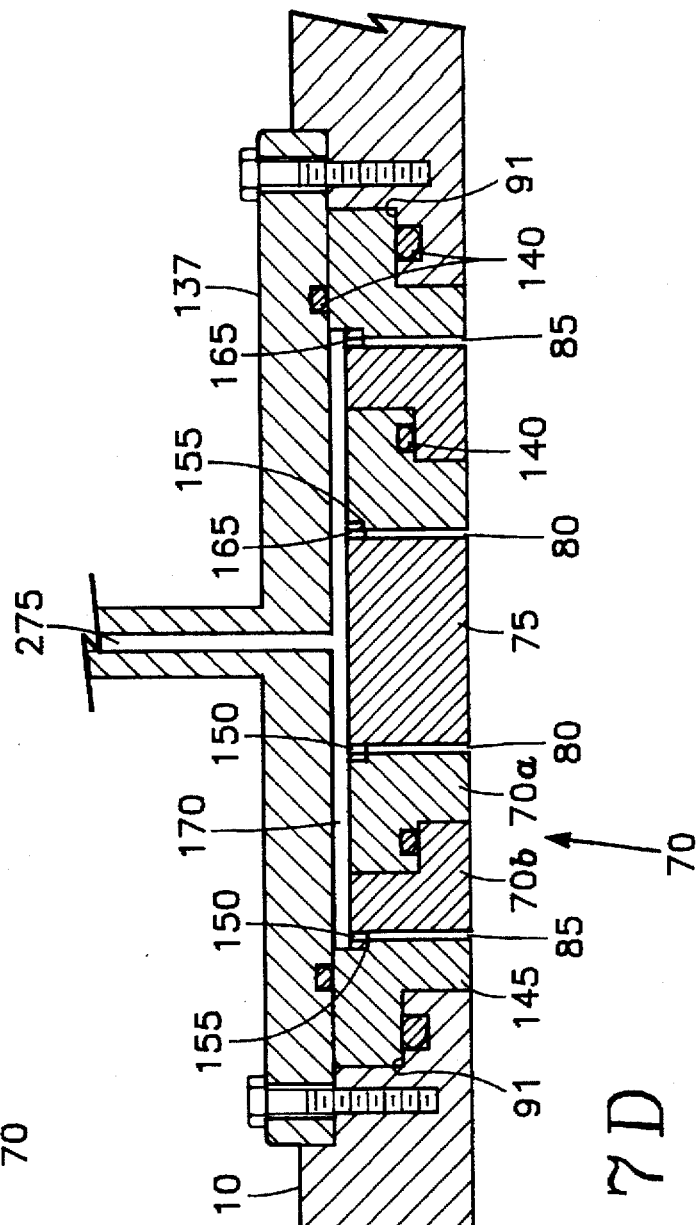
FIG. 7D is a cross-sectional view of a two-slit version of the embodiment of FIG. 7B.

FIG. 7D is a cross-sectional view of a two-slit version of the embodiment of FIG. 7B, in which the disk 75 and annular member 70 are cylindrical and are each contained within the lid 10, the inner and outer slotted apertures 80, 85 extending vertically or parallel to the axis of symmetry of the disk and annulus 75, 70. An outer ring 145 surrounds the outer slotted aperture 85. The annular member 70 of FIG. 7D comprises a pair of annular members 70a, 70b. In a preferred implementation, the pair of annular members 70, 70b may be formed as a single integral member, eliminating the seal between them. In the embodiment of FIG. 7D, the outer ring 145 is L-shaped so that it rests on the ledge 91. The annulus 70 (70b) has plural circumferentially spaced ears 150 extending radially outwardly from its outer circumference and nesting in a ledge in the inner circumference of the outer ring 145, the ears 150 there supporting the annulus 70. The ears 150 on the annulus transfer the weight of the annulus 70 to the outer ring 145. Likewise, the center disk 75 is supported by plural circumferentially spaced ears 150 extending from its outer circumference and nesting in slots 155 in the annulus 70. The spaced ears 150 form gaps 165 (illustrated in FIG. 7G) therebetween so that the ears 150 do not prevent gas flow through the gas flow passages 80, 85. (It should be noted that the feature of the ears 150 nesting in slots 155 described here with reference to FIG. 7D is also employed in the embodiment of FIG. 7B.) Conventional O-rings 140 provide seals to restrict gas flow to the slotted apertures 80, 85 and maintain vacuum integrity for the chamber. A gas manifold 170 formed between the mounting ring 137 and the top surfaces of the gas distribution hardware receives gas from the gas inlet supply passage 275, the gas flowing out of the manifold 170 through the slotted apertures 80, 85 to the interior of the reactor chamber. In a preferred implementation of the embodiment of FIG. 7D, the annular members 70a, 70b, the disk 75 and the outer ring 145 may be polyimide but are preferably ceramic and about 1.2 cm thick. The lid 10 was formed of aluminum anodized on the bottom surface facing the reactor chamber. In general, the structure defining the slotted apertures, including the annular members 70, disk 75 and ring 145 may be formed of any of the previously mentioned ceramic, fused quartz, polymeric, or anodized aluminum materials. The flange or mounting ring 137 was formed of stainless steel and the O-rings 140 were of a conventional type suitable for use with corrosive gases. The combination of stainless steel mounting ring 137/supply passage 275 and ceramic, fused quartz, or polymeric slotted apertures 80, 85 provides a gas distribution structure having no aluminum and which is therefore much more resistant to attack from corrosive gases. The slotted apertures 80, 85 were 0.5 mm gaps.

FIG. 7E illustrates a three-slot version of the embodiment of FIG. 7C and is identical in most respects with the exception of the replacement of the annular member 70 with the inner and outer annular members 72, 74. FIG. 7F illustrates a three-slot version of the embodiment of FIG. 7D and is identical in most respects with the exception of the replacement of the annular members 70a, 70b with the inner and outer annular members 72a, 72b, 74a, 74b. The pair of annular members 72a and 72b may be combined as a single integral member (eliminating the seal between them) and, similarly, the pair of annular members 74a, 74b may be combined as a single integral member.

The embodiment of FIG. 7B has been tested in a production environment. As many as 12,000 six-inch diameter wafers have been processed in a single reactor, with approximately 135,000 such wafers being processed overall, using a ceramic version of the embodiment of FIG. 7B. In all this testing, none of the plasma reactor chambers showed any signs of significant particle contamination increase. The particle contamination levels remaining within acceptable process limits in all cases. Visual inspection of the slit nozzle parts showed no signs of degradation or wear due to exposure to the corrosive etch chemistry. Furthermore, the anodized chamber side of the lid surrounding the slit nozzle showed no signs of wear or corrosion. In comparison, for chambers equipped with a conventional gas distribution plate, the gas distribution plate typically shows enough wear or degradation to require replacement after processing of only 5,000 wafers. This comparison demonstrates the longer life and lower cost of consumable materials realized in the present invention relative to conventional gas distribution plates currently employed in typical plasma reactor chambers.

Figure 8:
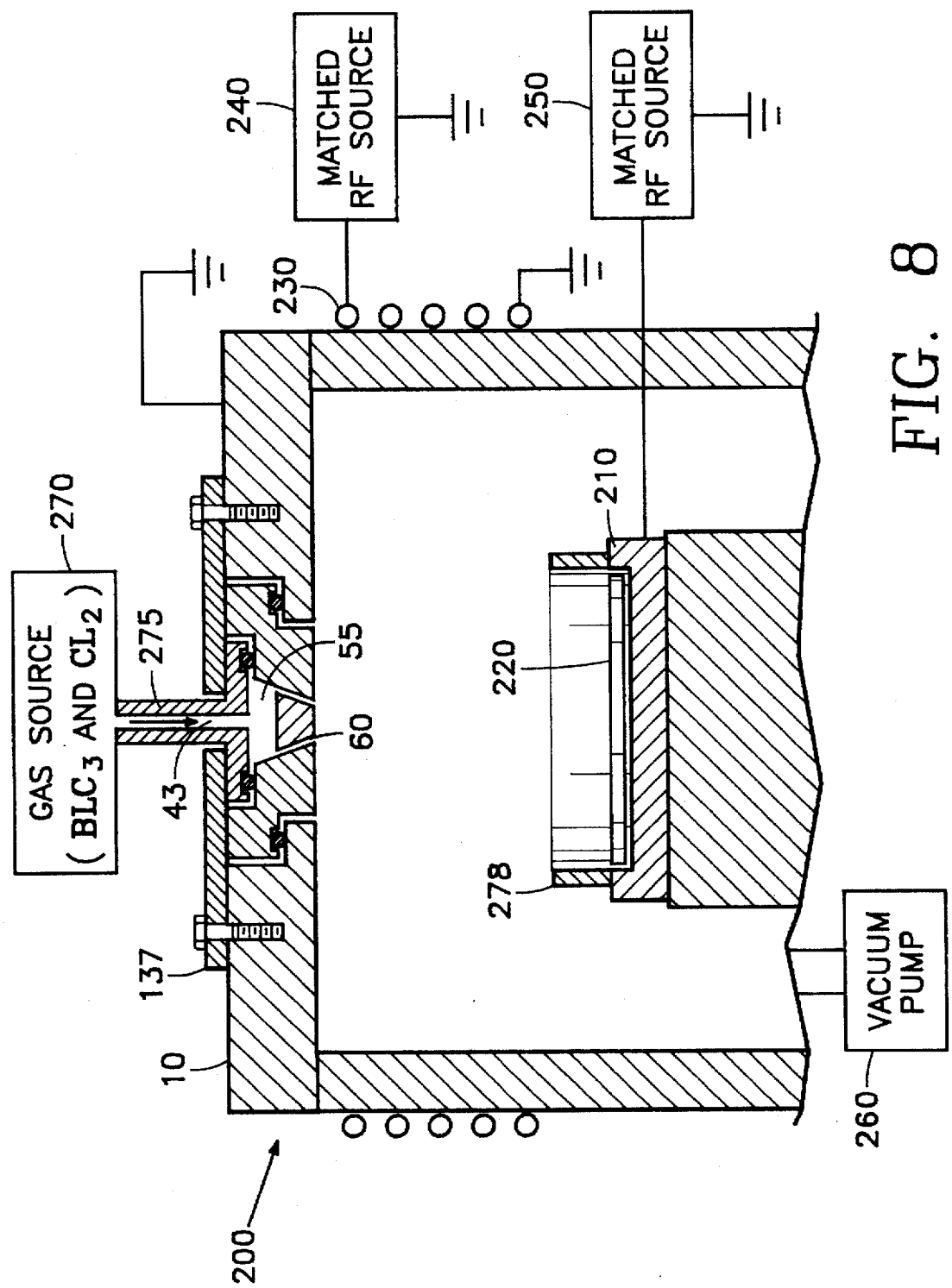
FIG. 8 is a cross-sectional view of nearly an entire plasma reactor in which the embodiment of FIG. 7A is installed.

FIG. 8 illustrates a plasma reactor having the gas distribution apparatus of FIG. 7A. The lid 10 is part of a cylindrical chamber housing 200 containing a wafer pedestal 210 supporting a semiconductor wafer 220 which is to be processed. An RF coil antenna 230 wrapped around the reactor chamber housing 200 is powered by a matched RF source 240, constituting the plasma source power. A bias RF power source 250 controlling the ion bombardment energy is connected to the wafer pedestal 210. However, other RF power source configurations may be employed. For example, a magnetically enhanced reactive ion etch apparatus can be employed in which the RF antenna coil and RF source are replaced with electromagnetic coils and the RF power is input only to the wafer pedestal 210. A vacuum pump 260 and throttle valve (not shown) control the chamber interior gas pressure. A gas supply 270 is connected through a steel inlet tube 275 to the gas distribution manifold 55 of the gas distribution apparatus.

Figure 9:
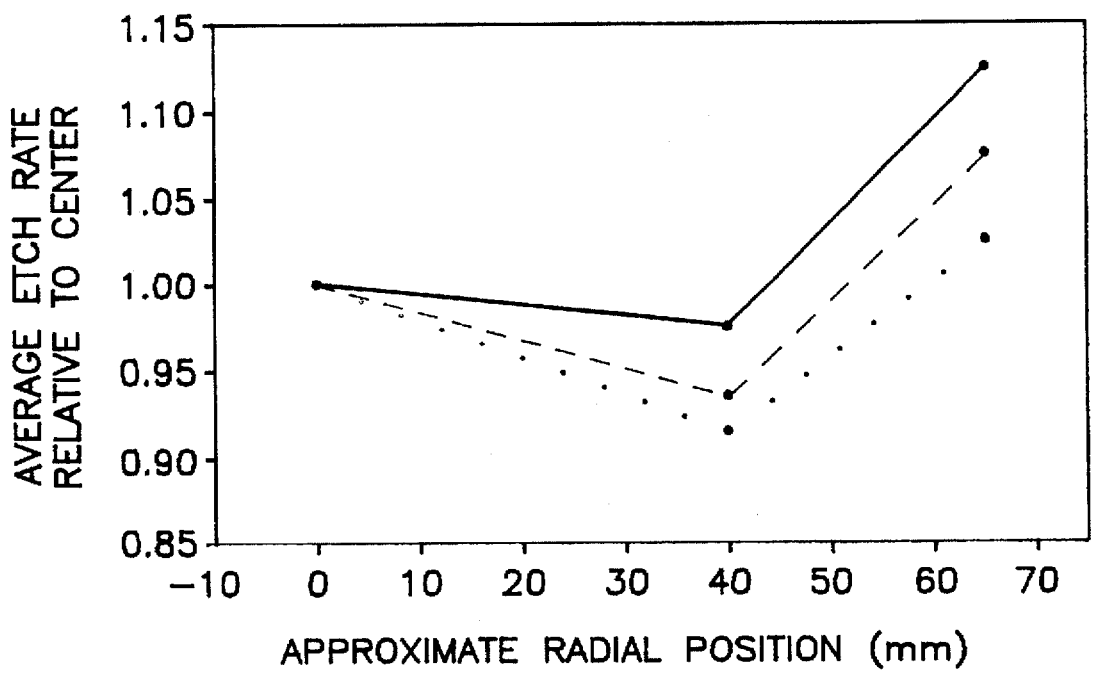
FIG. 9 is a graph illustrating etch rate uniformity across the wafer surface as a function of the diameter of the gas distribution slotted nozzle of FIG. 7B.

FIG. 9 illustrates how the diameter of the slotted aperture nozzle 60 of FIG. 7B can be varied to select a desired etch rate distribution across a 150 mm diameter wafer. It is noted that the diameter of a slotted aperture nozzle is defined as the radial distance from the center of the gas distribution apparatus to the innermost edge of a nozzle slot. FIG. 9 shows the average etch rate as a function of radial position normalized to the etch rate at the center of the wafer. The etch rate at the middle and edge increases relative to the center as the diameter of the slotted nozzle is increased from 2.5 cm (dotted line curve) to 3.3 cm (dashed line curve) and then to 3.7 cm (solid line curve). In an implementation corresponding to FIG. 6B but with a single circular slit, increasing the nozzle diameter from 1.8 cm, to 2.5 cm and then to 3.1 cm provided respective deviations in etch rate nonuniformity across the wafer diameter of 24%, 12% and 8%, respectively.

Figure 10:
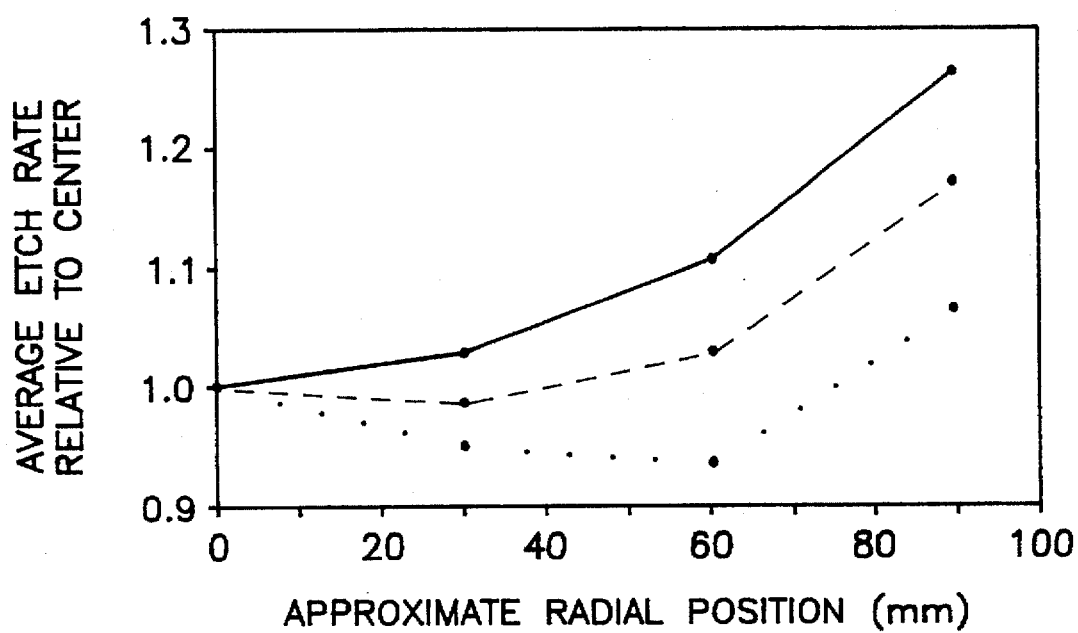
FIG. 10 is a graph illustrating the effect on etch rate uniformity across the wafer surface of the combination of plural slotted nozzles of different diameters.

FIG. 10 illustrates the etch rate distribution across a 200 mm diameter wafer for a double slit configuration. The data in FIG. 10 correspond to the embodiment of FIG. 7D. The slits 85, 80 were 4 inches (10 cm) and 1.5 inches (3.7 cm), respectively, in diameter. Three tests were performed by blocking, respectively, the 3.7 cm slit only (solid line curve), the 10 cm slit only (dotted line curve) and by blocking neither slit (dashed line curve). Consistent with FIG. 9, the etch rates at the middle and edge of the wafer increase relative to the center of the wafer as the slit diameter is increased. Furthermore, the etch rate distribution across the wafer with the double slit configuration lies between those for the single slit runs. In summary, the data of FIGS. 9 and 10 shows that the etch rate variation from center to the outer middle region of the wafer (i.e., from 0 to 40 mm radial position for 150 mm wafers and from 0 to 60 mm radial position for 200 mm wafers) can be minimized by adjusting the slit diameter(s). The present invention provides etch rate uniformity on a par with that of conventional gas distribution apparatus while providing far greater advantages in resistance to corrosion and ease of assembly, as will be discussed below.

Figure 11:
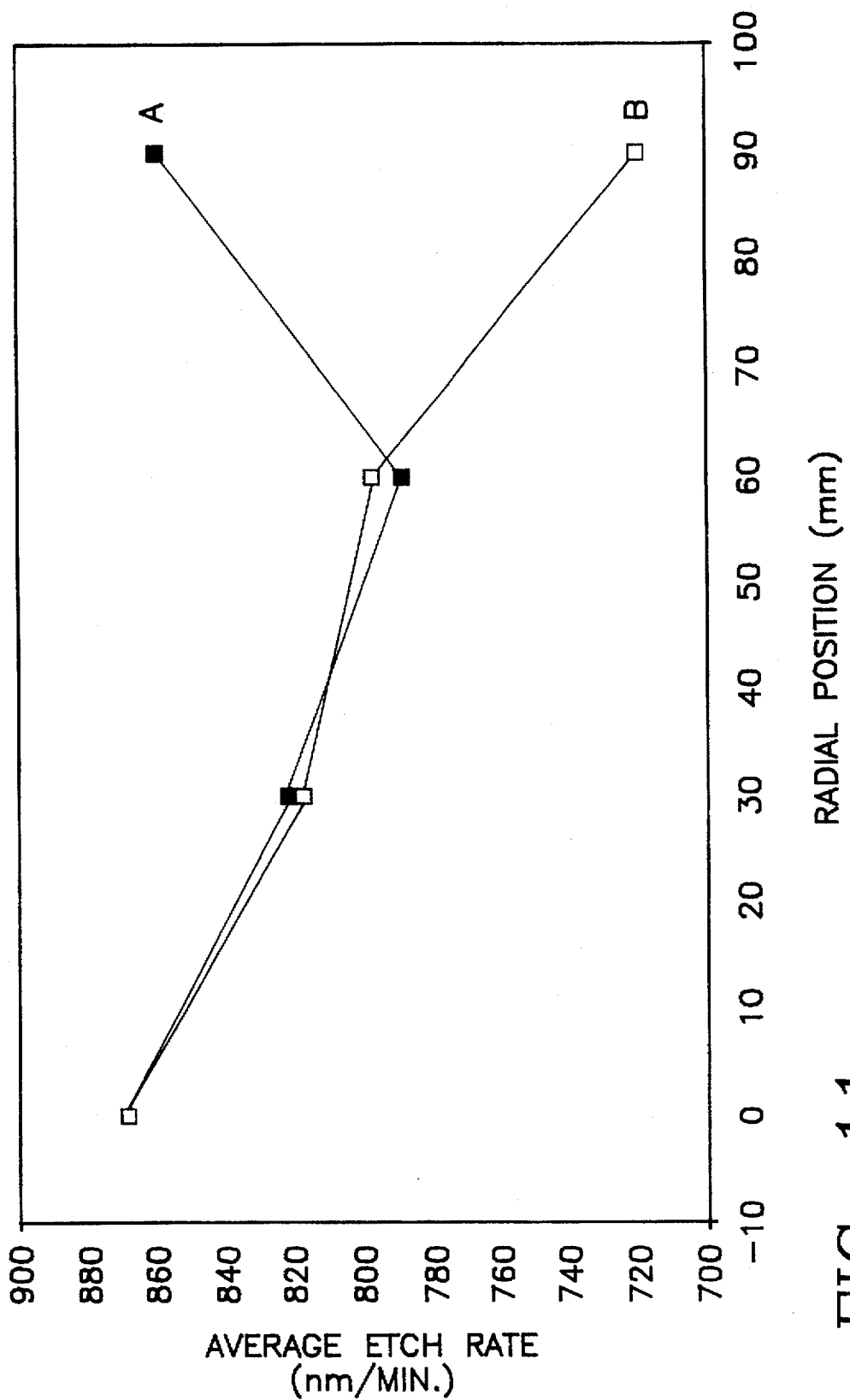
FIG. 11 is a graph comparing etch rates across the wafer surface with the focus ring (white square curve) and without the focus ring (black square curve).

Referring again to FIG. 8, in order to decrease or control the etch rate near the wafer periphery, a focus ring 278 may be added surrounding the wafer periphery. The focus ring reduces the flow of etchant species across the chemical boundary separating the plasma region over the wafer center having a scarcity of etchant species ions and the plasma region beyond the wafer periphery having a plenitude of etchant species ions. FIG. 11 illustrates how the addition of the focus ring reduces the etch rate near the periphery of a 200 mm diameter wafer from a high rate of about 860 nm/min (black square curve) to a low rate of about 720 nm/min (white square curve). The fact that the focus ring strongly modulates the etch rate at the wafer periphery implies that etch rate variation across the wafer can be minimized by judicious selection of nozzle diameter(s) combined with focus ring height.

Overall, etch rate uniformity comparable to that achieved with conventional gas distribution plates has been demonstrated with the present invention, while providing far greater advantages in resistance to corrosion. As mentioned hereinabove, conventional gas distribution plate are typically designed with more orifices per unit area over the wafer center to enhance the etch rate at the wafer center. An advantage of the present invention is that, despite having a very small number of slotted aperture nozzles (compared to the large number of small orifices in a conventional gas distribution plate), it inherently delivers sufficient gas over the center of the wafer to achieve the same etch rate uniformity.

Figure 13:
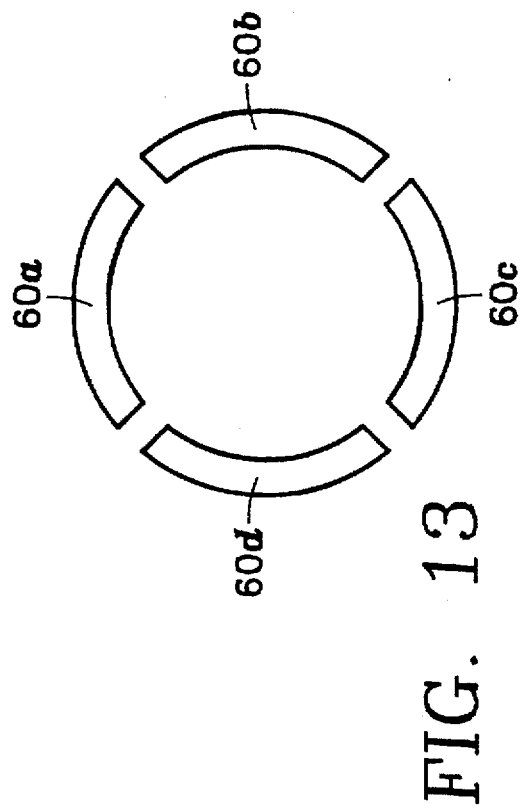
FIG. 13 is a bottom view of a slotted nozzle in accordance with a further aspect of the invention consisting of plural discrete arcuate sections.
Figure 12:
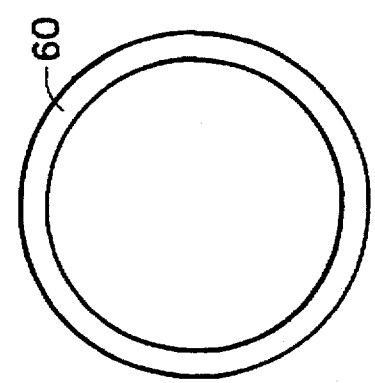
FIG. 12 is a bottom view of a circular slotted nozzle in accordance with one aspect of the invention.
Figure 15:
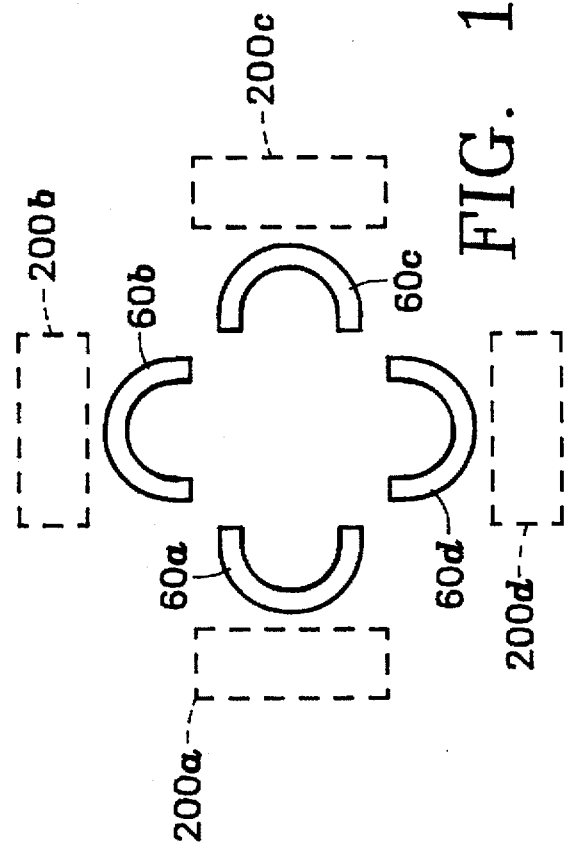
FIG. 15 illustrates how the slotted nozzle of FIG. 14 may be segmented and how the segments may be oriented relative to external magnets of an ME-RIE plasma reactor.
Figure 14:
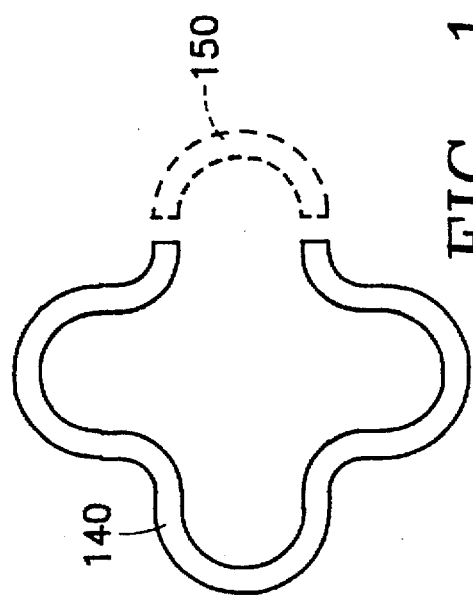
FIG. 14 is a bottom view of a slotted nozzle in accordance with a yet further aspect of the invention having a meandering curved shape divisible into plural arcuate sections.

FIG. 12 is a bottom view of the circular slotted aperture nozzle 60 of FIG. 1C. FIG. 13 illustrates how the nozzle 60 may be segmented into discrete arcuate sub-sections 60a–60d, while FIG. 14 illustrates how the nozzle 60 can follow a meandering arcuate path 140 having a portion 150 thereof deleted, rather than a circular path. FIG. 15 illustrates how the embodiment of FIG. 14 can be segmented into separate arcuate sub-sections. The embodiments of FIGS. 13–15 could be useful for applications in magnetically enhanced reactive ion etch (ME-RIE) reactors in which the corners between adjacent external magnets of the reactor have somewhat higher magnetic fields and therefore higher etch rates with a uniform etchant gas distribution. This nonuniformity can be compensated by aligning the gaps between adjacent sections 60a–60d of the slotted aperture nozzle 60 over the regions of high magnetic field density. In the case of an ME-RIE plasma reactor, such an alignment is shown in FIG. 15 by indicating in dashed line the relative orientation of the four external magnets 200a–200d of the reactor with reference to the four discrete nozzle sections 60a–60d. It is currently believed that such fine tuning of etch rate uniformity is not necessary.

In the embodiments of FIGS. 1C, 1D, 7A and 7B employing a single slotted aperture 60, the aperture diameter is generally in the broad range of 0.5 inches (1.2 cm) to 6.0 inches (15 cm), although the preferred range is 1.0 inches (2.5 cm) to 2.0 inches (5.0 cm). In the embodiments of FIGS. 4A, 4B, 7C and 7D employing a pair of slotted apertures 80, 85, the outer slotted aperture diameter is generally in the broad range of 3.0 inches (7.5 cm) to 6.0 inches (15 cm) with the preferred diameter being about 4.0 inches (10 cm), and the inner slotted diameter is generally in the broad range of 0.5 inches (1.2 cm) to 2.0 inches (5.0 cm) with the preferred diameter being about 1.5 inches (3.7 cm). In the embodiments of FIGS. 6A, 6B, 7E and 7F employing three slotted apertures 80, 90, 85, the aperture diameters in one example may be on the order of about 0.3 inch (0.8 cm), 1.0 inch (2.5 cm) and 1.25 inches (3.0 cm), respectively, or, alternatively, 4 inches (10 cm), 2.5 inches (6.3 cm) and 1 inch (2.5 cm), respectively.

Advantages of the Invention

The invention provides a combination of advantages over conventional gas distribution plates. Because it is a modular assembly with separate pieces forming elongate apertures or nozzles with a gap not exceeding the plasma sheath thickness, the separate pieces are polished externally so that no surface imperfections can contribute to degradation or particle contamination in a corrosive gas environment. Moreover, the absence of any drilled holes permits the use of any corrosive-resistant materials such as the aforementioned ceramic, fused quartz, or polymeric materials, which, in combination with a stainless steel gas inlet, provides a gas distribution apparatus virtually impervious to attack from corrosive gases. The modular design provides drop-in self-aligning assembly for ease of manufacture. Despite the small number of nozzles compared with conventional gas distribution plates, the invention achieves comparable etch rate uniformity and design versatility while at the same time providing cycle lifetime many times that of conventional gas distribution plates. This in turn provides greater throughput by reducing frequency of production down-time for replacing consumable materials.

Additional Advantageous Embodiments

FIGS. 16A–B and 17–22 depict additional embodiments of a gas distribution apparatus in accordance with the present invention. These additional embodiments are generally related to the embodiments of FIGS. 7A–F, and provide similar advantages. However, the new embodiments also provide other advantages, as well.

Figure 16A:
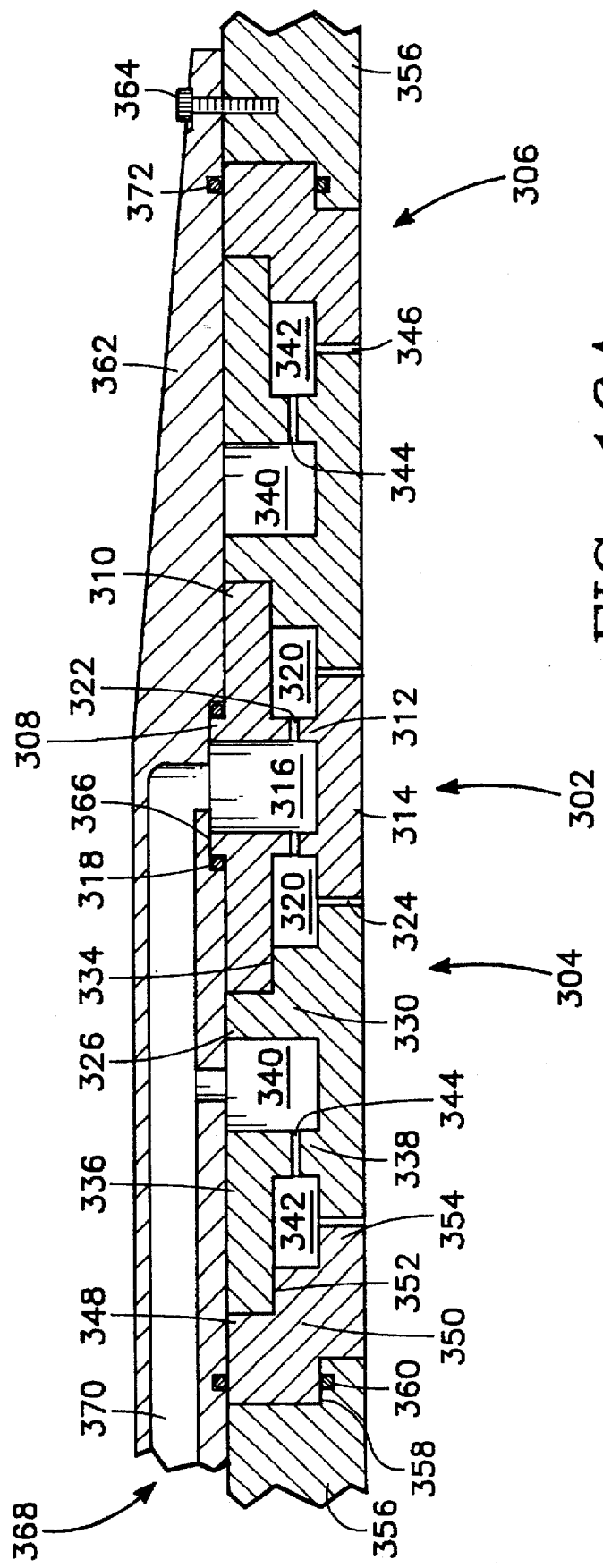
FIG. 16A is a cross-sectional view of another top-inserted version of a two-slot "in-lid" embodiment of the invention.
Figure 16B:
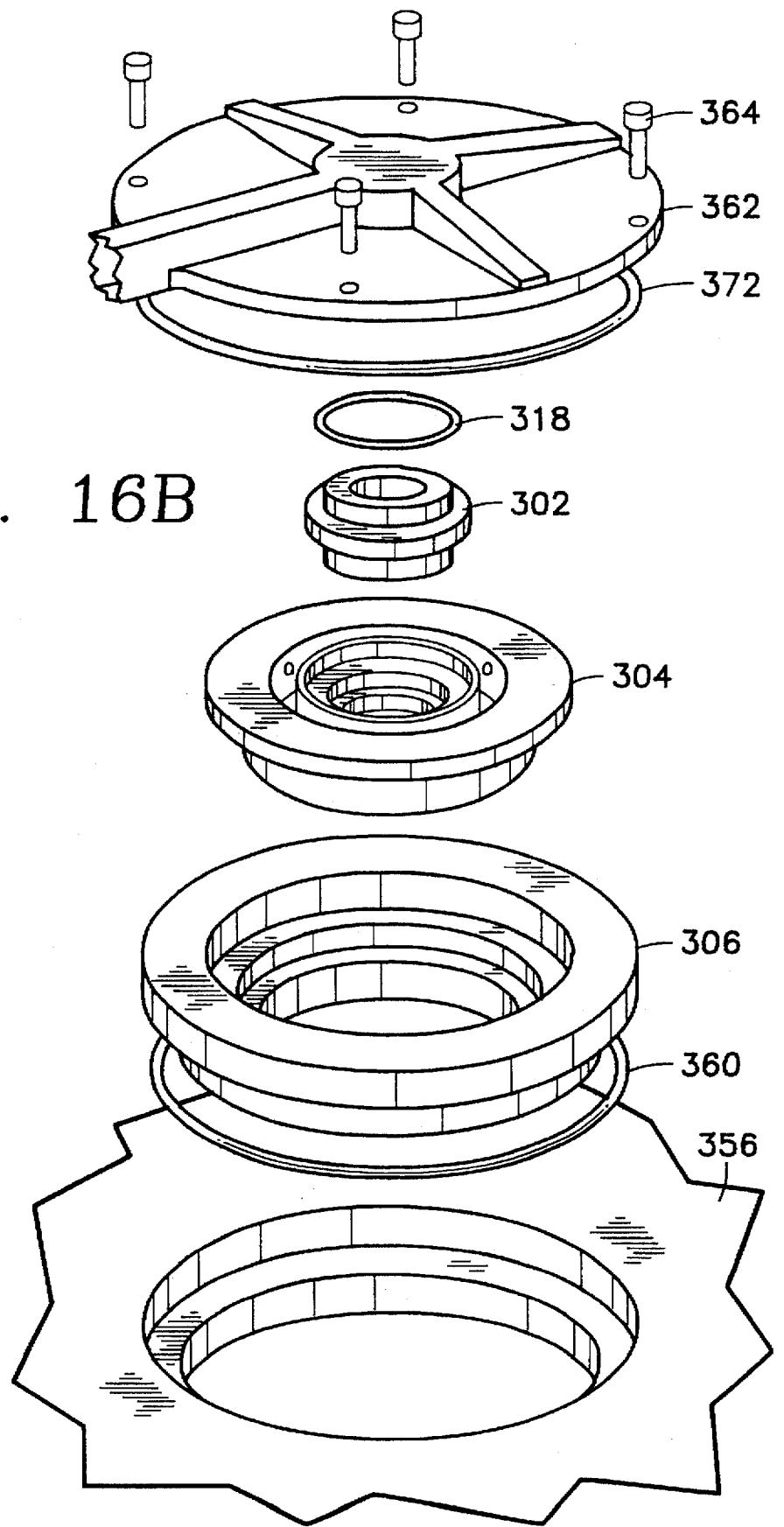
FIG. 16B is a perspective exploded view of the two-slot embodiment of FIG. 16A.

Referring to FIGS. 16A–B, a two-slot embodiment is shown having a center member 302, an intermediate member 304, and an outer member 306. FIG. 16A is a cross-sectional view of the embodiment, and FIG. 16B is an isometric exploded view of the embodiment. The center member 302 has the shape of a stepped cylinder. Starting at its upper end, the member 302 has first, second, and third annular portions 308, 310, 312, and a disk-shaped bottom 314. The inner diameter of the annular portions 308, 310, 312 is the same, thereby forming a cylindrical-shaped central cavity 316. The uppermost (first) annular portion 308 has an outer diameter which is less than that of the adjacent second annular portion 310, thereby forming a shelf. This shelf is used to support a compression O-ring 318 having an inner diameter approximately the same as the outer diameter of the first annular portion 308. The purpose for the O-ring 318 will be discussed in detail later. The third annular portion 312 also has an outer diameter less than that of the second portion 310. The purpose for this smaller diameter is to form part of an annular manifold 320 in conjunction with the aforementioned intermediate annular member 304. There are a number of holes 322 formed between the central cavity 316 and the manifold 320 in the third annular portion 312. The number, placement, and purpose for these holes 322 will be also discussed later. Finally, the disk-shaped bottom 314 of the center member 302 has a diameter larger than that of the third annular portion 312. The peripheral edge of the bottom portion 314 forms the inner edge of the innermost slotted aperture 324. Accordingly, as will be seen, its exact diameter is a function of the desired aperture width and diameter.

The intermediate member 304 has the shape of a stepped annulus and is designed to interface with the center member 302 and the outer member 306. The center member 302 nests into the center void of the intermediate member 304. The intermediate member 304 can be thought of as having upper, middle, and lower portions. The upper portion has two annular sections 326, 336. The innermost annular section 326 interfaces with the second annular portion 310 of the center member 302 and has an inner diameter which is approximately the same as the outer diameter of the second annular portion 310. This facilitates the aforementioned nesting of the center member 302 into the intermediate member 304, and ensures the two members 302, 304 are concentric. The middle portion also has two annular sections 330, 338, the innermost of which (i.e. section 330) has an outer diameter corresponding to the outer diameter of the innermost annular section 326 of the upper portion. The inner diameter of the middle portion's innermost annular section 330 is smaller than that of the upper portion's. This creates a ledge 334 which supports the bottom of the second annular portion 310 of the center member 302. The inward facing edge of the innermost annular section 330 of the middle portion forms the other wall of the aforementioned manifold 320. It is also noted that the thickness of the second annular portion 310 corresponds to the thickness of the innermost annular section 326. Thus, the top surface of the second annular portion 310 is flush with the top surface of the intermediate member 304. The outer annular sections 336, 338 of the upper and middle portions have the same inner diameters and are spaced radially from the corresponding innermost annular sections 326, 330. The net result of this is to form an annular cavity 340. The outer annular section 338 of the middle portion has an outer diameter which is less than that of the outer annular section 336 of the upper portion. The purpose for this is to form one wall of a second annular manifold 342. There are also a number of holes 344 formed between the aforementioned annular cavity 340 and the second manifold 342 in the outer annular section 338 of the middle portion. Like, the holes 322, the number, placement, and purpose of holes 344 will be discussed later. Finally, the lower portion of the intermediate member 304 forms a single annulus which bridges the gap (i.e. the annular cavity 340) between the annular sections 326, 330, 336, 338 of the upper and middle portions. The inner periphery of the lower portion forms the outer edge of the aforementioned innermost slotted aperture 324. Thus, the inner diameter of the lower portion is sized to create the desired aperture width and diameter, in conjunction with the bottom portion 314 of the center member 302. The outer periphery of the lower portion has a diameter larger than that of the outer annular section 338 of the middle portion. In addition, the outer peripheral edge of the lower portion forms the inner edge of an outer slotted aperture 346. As in the case of the innermost aperture 324, the exact diameter of this outer peripheral edge is a function of the desired aperture width and diameter.

The outer member 306 also has the shape of a stepped annulus, and is designed to interface with the intermediate member 304 which nests into its center void. As with the intermediate member 304, the outer member 306 can be thought of as having upper, middle, and lower portions. The upper portion 348 is an annulus with an inner diameter approximately the same as the outer diameter of the outer annular section 336 of the intermediate member 304. This allows the aforementioned nesting of the intermediate member 304 into the outer member 306, and ensures these two members 304, 306 are concentric. The middle portion 350 of the outer member 306 also has an annular shape with an outer diameter corresponding to the outer diameter of the upper portion 348. The inner diameter of the middle portion 350 is smaller than that of the upper portion 348. This creates a ledge 352 which supports the bottom of outer annular section 336 of the intermediate member 304. In addition, the inner peripheral edge of the middle portion 350 forms another wall of the aforementioned second annular manifold 342. Finally, the lower portion 354 of the outer member 306 is an annulus with an inner periphery forming the outer edge of the aforementioned outer slotted aperture 346. The inner diameter of the lower portion 354 is sized to create the desired aperture width and diameter, in conjunction with the lower portion of the intermediate member 304. The outer periphery of the lower portion 354 of the outer member 306 has a diameter smaller than that of the upper and middle portions 348, 350. This creates an annular notch which facilitates the assembly of the gas distribution apparatus into the chamber lid 356. Specifically, there is a stepped hole formed in the lid 356. The diameter of the upper portion of the hole corresponds to the outer diameter of the outer edges of the upper and middle portions 348, 350 of the outer member 306. Whereas, the lower portion of the hole adjacent to the ceiling of the chamber has a diameter corresponding to the outer edge of the lower portion 354 of the outer member 306. Thus, a ledge 358 is formed upon which the bottom of the middle portion 350 of the outer member 306 rests. In addition, this ledge 358 has an annular groove formed therein. The groove accommodates a sealing O-ring 360 which maintains vacuum integrity for the chamber.

The thickness of the annular sections 326, 336 of the upper portion of the intermediate member 304 corresponds to the thickness of the upper portion 348 of the outer member 306. This means the top surface of the intermediate member 304 is flush with the top surface of the outer member 306, as well as the second annular portion 310 of the center member 302. The net result of this is that, once nested, the three members 302, 304, 306 exhibit a planar surface with the exception of the first annular portion 308 of the center member 302 which extends slightly above the surface plane of the gas distribution apparatus. In addition, the thicknesses of the remaining portions of the three members 302, 304, 306 are such that the bottom surface of the apparatus is also approximately planar, and in a preferred version, flush with the chamber's ceiling. This flush mounting, along with the ledge 358 machined around the opening through the lid 356 which supports the gas distribution apparatus, enables the apparatus to fit entirely within the lid 356, and to be secured from downward movement caused by the pressure differential between ambient and the vacuum chamber. Consequently, there is no need for an attached floor (such as the floor 100 of FIG. 4A), or fasteners on the chamber side of the apparatus, both of which would be susceptible to degradation from the plasma. Also, the apparatus may be installed without removing the lid 356. This should reduce downtime during its replacement. Although the aforementioned feature by which the bottom of the gas distribution apparatus is flush with the chamber ceiling is preferred, it would be possible to have the apparatus extend towards the wafer if desired to enhance the gas distribution. For example, the thickness of the disk-shaped bottom of the center member, as well as the lower portions of the intermediate and outer members could be increased. This would provide the desired extension and place the slotted apertures closer to the surface of the wafer.

In general, above-described gas distribution apparatus may be formed of any of the previously described ceramic, fused quartz, polymeric, or anodized aluminum materials. As with some of the embodiments of FIGS. 7A–F, each element of the present apparatus can be polished prior to assembly. In addition, as only relatively large diameter holes 322, 344 are required to be formed in the center and intermediate members 302, 304, the apparatus can be advantageously made of the aforementioned ceramic, fused quartz, or polymeric material. Such materials are highly impervious to corrosive gas environments, and so provide a long life and reduce the risk of wafer contamination.

A disk-shaped cover 362 is used to seal and secure the gas distribution apparatus to the chamber. The cover 362 has a diameter larger than that of the apparatus and is fastened to the outside of the lid 356. This can be accomplished by the use of bolts 364 which are installed through holes in the cover 362 and treaded into bolt holes formed in the lid 356. A cylindrical cavity 366 is formed at the center of the cover 362. The cavity 366 has a diameter approximately the same as the compression O-ring 318 and a depth approximately the same as the first annular portion 308 of the center member 302. Once installed, the cover 362 provides a downward force against the compression O-ring 318. This, in turn, forces the three member 302, 304, 306 of the apparatus together and keeps them in place. The cover 362 also has a gas inlet structure 368 which interfaces with the central and annular cavities 316, 340. This gas inlet 368 is shown as a straight channel 370 having openings to the cavities 316, 340. It is noted that these channel openings need not be the same size as the cavities 316, 340, as shown in FIG. 16A where the cover 362 slightly overhangs the cavities 316, 340. However, alternately, the gas inlet structure 368 might include an annular channel (not shown) which extends away from the straight channel 370 and opens into the annular cavity 340 over its entire length. This alternate gas inlet structure may provide a better distribution of gas in the annular channel under some circumstances. In operation, the gas inlet 368 receives gas from a gas inlet supply (not shown). Thereafter, the gas flows through the channel 370 and into the central and annular cavities 316, 340. From the cavities 316, 340 the gas flows through the holes 322 in the center member 302, and holes 344 in the intermediate member 304, and into the inner and outer manifolds 320, 342. Finally, the gas exits the gas distribution apparatus through the slotted apertures 324, 346 and into the interior of the reactor chamber. The manifolds 320, 342 are used to help ensure a uniform flow out of the slotted apertures 324, 346. It is noted that the embodiment of FIGS. 16A–B exhibits a vertical gas flow. This is preferred. The cover 362 also has an annular groove which faces the outer member 306, when the cover 362 is installed. A sealing O-ring 372 is disposed in this groove and provides a seal between the cover 362 and the gas distribution apparatus to restrict gas flow to only the slotted apertures 324, 346 and maintain vacuum integrity for the chamber. The cover 362 is preferably made of stainless steel which is resistant to the corrosive effects of the gases, and the O-rings 318, 360, 372 can be of a conventional type suitable for use with corrosive gases.

It is also noted that the embodiment of FIGS. 16A–B provides a very robust design in that the ears 150 relied upon in the embodiments of FIGS. 7B, 7D, and 7F–G are eliminated. These ears 150, though quite acceptable, are fragile if the aforementioned ceramic, fused quartz, or polymeric materials are employed, and can be somewhat difficult to manufacture. In addition, the "line of sight" structure employed in the embodiments of FIGS. 7A–F is eliminated in the present embodiment of FIGS. 16A–B. A "line of sight" structure is one which provides a straight line path between the interior of the chamber and the gas source inlet. Although the width of the slotted aperture is preferably designed to prevent a plasma discharge from entering the aperture, should this occur, the slotted apertures of the embodiments of FIGS. 7A–F would provide a direct pathway to the manifold area and the gas inlet. This is disadvantageous because heavy ion contamination of the wafer can occur due to sputtering of the stainless steel gas source inlet by the intruding plasma discharge. Whereas, in the embodiment of FIGS. 16A–B, the plasma would have to follow a circuitous route through the annular manifolds 320, 342, passing into the holes 322,344 and finally up the cavities 316, 340 and along the gas inlet channel 370 to reach the gas inlet. Such a circuitous route makes it virtually impossible for the plasma to intrude, and in the unlikely event that it did, no sputtered material from the gas source inlet could find its way into the chamber to contaminate the wafer.

Figure 17:
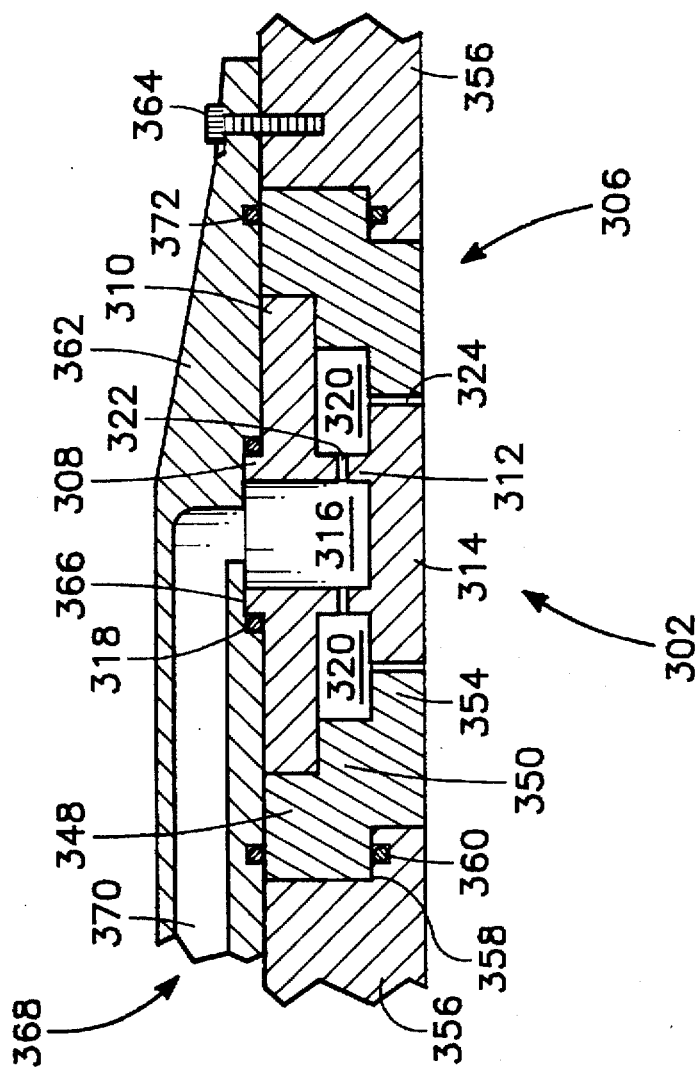
FIG. 17 is a cross-sectional view of a top-inserted version of a single slot "in-lid" embodiment of the invention related to the embodiment of FIGS. 16A-B.
Figure 18:
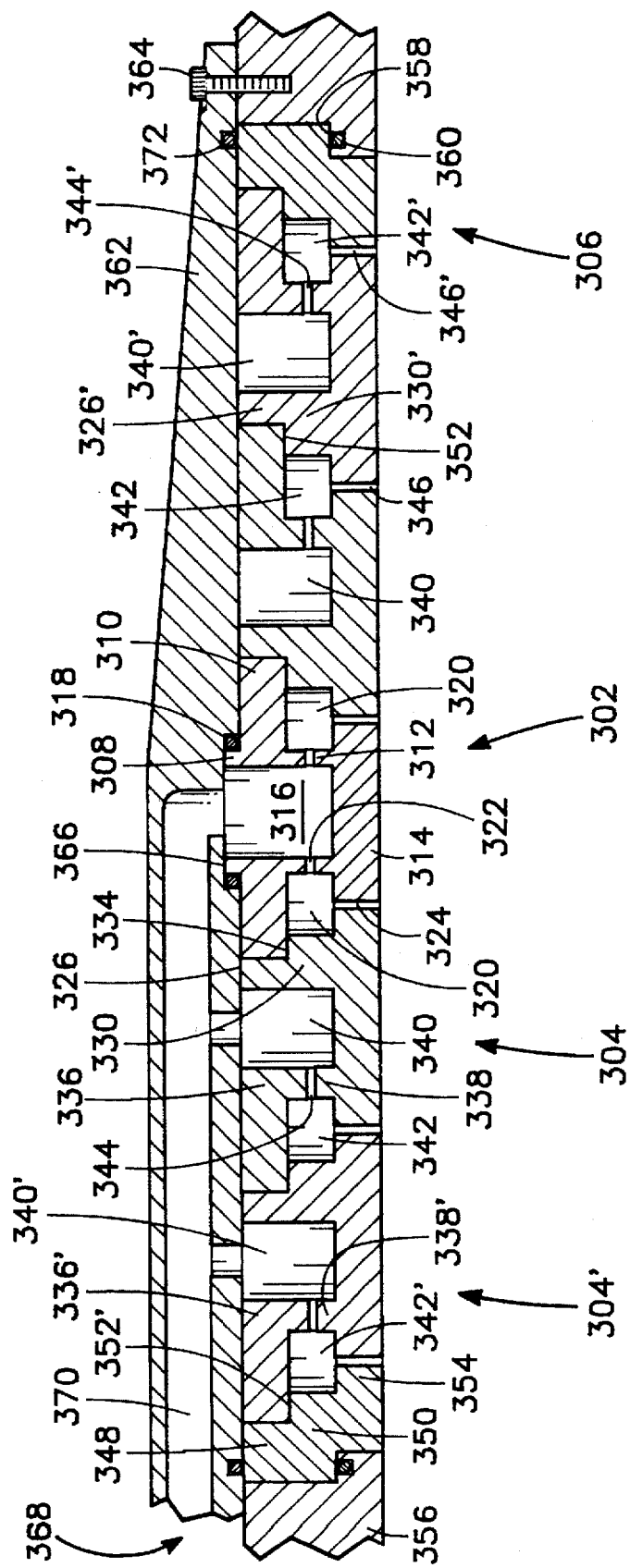
FIG. 18 is a cross-sectional view of a top-inserted version of a three-slot "in-lid" embodiment of the invention related to the embodiment of FIGS. 16A-B.

FIG. 17 shows a one-slot version of the embodiment of FIGS. 16A–B. This version is identical in structure with the exception that the intermediate member has been eliminated and the outer member 306 has been downsized in diameter to interface with the center member 302 in the same way it interfaced with the intermediate member in the two-slot embodiment. The number of slotted apertures of the embodiment of FIGS. 16A–B can be increased as well. This is accomplished by the incorporation of additional intermediate members 304' (of appropriate diameters) between the existing intermediate member 304 and the outer member 306. Each added intermediate member 304' results in one additional slotted aperture. Of course, for each new intermediate member 304', an additional opening in the gas inlet channel would have to be formed to correspond with the annular cavity of each new member 304'. FIG. 18 is an example of a three-slot version employing one additional intermediate member 304'.

It is noted that the embodiments of FIGS. 16A–B, 17, and 18 preferably employ the same aperture diameters and widths as described in connection with previous embodiments of the invention. Accordingly, it can be expected that the same advantageous performance characteristics will be enjoyed, as well.

Referring again to FIGS. 16A–B, 17, and 18, the holes 322 which provide passage of gases from the central cavity 316 to the inner manifold 320 in all the present embodiments, as well as the holes 344, 344' connecting the annular cavity 340, 340' with the outer manifold 342, 342' in the multiple-slot embodiments, have diameters partially determined by the desired flow rate out of the slotted apertures 324, 346, 346'. Ideally, a hole diameter would be chosen to provide a gas flow rate such that sufficient pressure is created in the manifolds 320, 342, 342' to produce the aforementioned desired flow rate out of the slotted apertures 324, 346, 346'. However, mechanical and fabrication constraints may dictate a different hole size. For example, if the gas distribution apparatus is made from the aforementioned ceramic, fused quartz, or polymeric materials, the hole diameters would preferably also be large enough to facilitate forming the holes 322, 344, 344'. If a small enough hole diameter cannot be readily formed (as dictated by the desired flow rate), larger holes 322, 344, 344' could be formed and inserts (not shown) fitted therein to restrict the flow. The construction and factors determining the design of an appropriate insert for the aforementioned task are well known to persons skilled in the art and do not constitute a novel aspect of the present invention. Accordingly, no detailed description of these insert will be provided herein.

Another factor that determines the flow rate from the slotted apertures 324, 346, 346' is the number of holes 322, 344, 344'. Thus, for a given easily formed hole diameter, the number of holes 322, 344, 344' can be varied to produce the aforementioned manifold pressures and aperture flow rates. It is believed that a wide variety of flow rates can be created by varying the number of holes employed, their diameters, and through the use of inserts. Also, preferably the holes 322, 344, 344' are equally spaced around the circumference of their associated member 302, 304, 304' to facilitate a uniform disbursement of gas into the manifolds 320, 342, 342'. This hole placement, in conjunction with the manifolds 320, 342, 342', ensures a more uniform gas flow to the slotted apertures 324, 346, 346'. The manifolds 320, 342, 342' are useful in accomplishing this task because they tend to smooth out the potentially jet-like flow pattern emanating from the holes 322, 344, 344'. Without the manifolds 320, 342, 342', the gas flow out of the apertures 324, 346, 346' would be concentrated near the location of the holes 322, 344, 344'.

In a tested two-slot embodiment, it was found that three holes 322 in the center member 302, and eight holes 344 in the intermediate member 304, all with a hole diameter of 0.125 inches, provided acceptable etch performance. The object of this particular configuration was to minimize flow resistance through the holes 322, 344, while balancing other design considerations. Specifically, the center member 302 was designed with three holes 322 to maximize the number of holes while ensuring structural integrity for slot aperture diameters down to 0.75 inches. Eight holes 344 were used in the intermediate member 304 to provide similar flow rates through each aperture (based on scaling analysis). A 0.125 inch hole was selected because it was the largest standard drill size that was practical to use with the manifold size employed. The manifold volume (and so its dimensions) was primarily determined by the need for a sufficient aspect ratio (slot height to slot width) to provide well developed flow in the aperture slot. As can be seen by selecting the number and diameter of the holes 322, 344, while balancing the other identified structural and flow considerations, the aforementioned acceptable etch performance was obtained. Similar optimization of the number and size of the holes 322, 344 can be performed to obtain acceptable performance for other reactor applications.

Figure 19B:
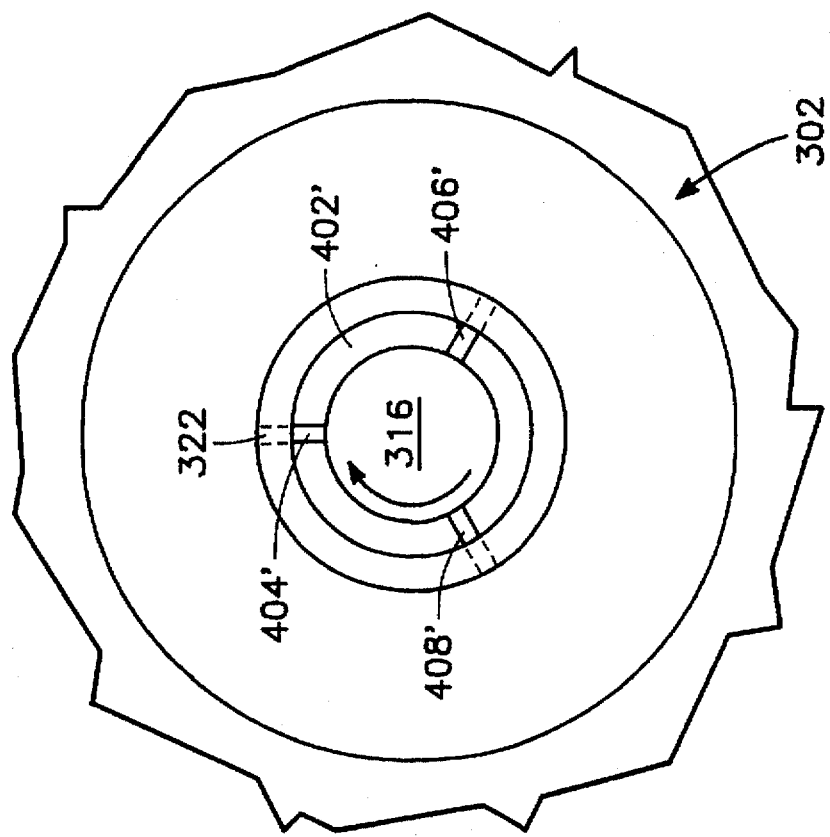
FIG. 19B is a top view of the center member of the gas distribution apparatus according to another version of the embodiments of FIGS. 16A-B, 17, or 18, incorporating a symmetrical rotatable blocking ring.
Figure 19A:
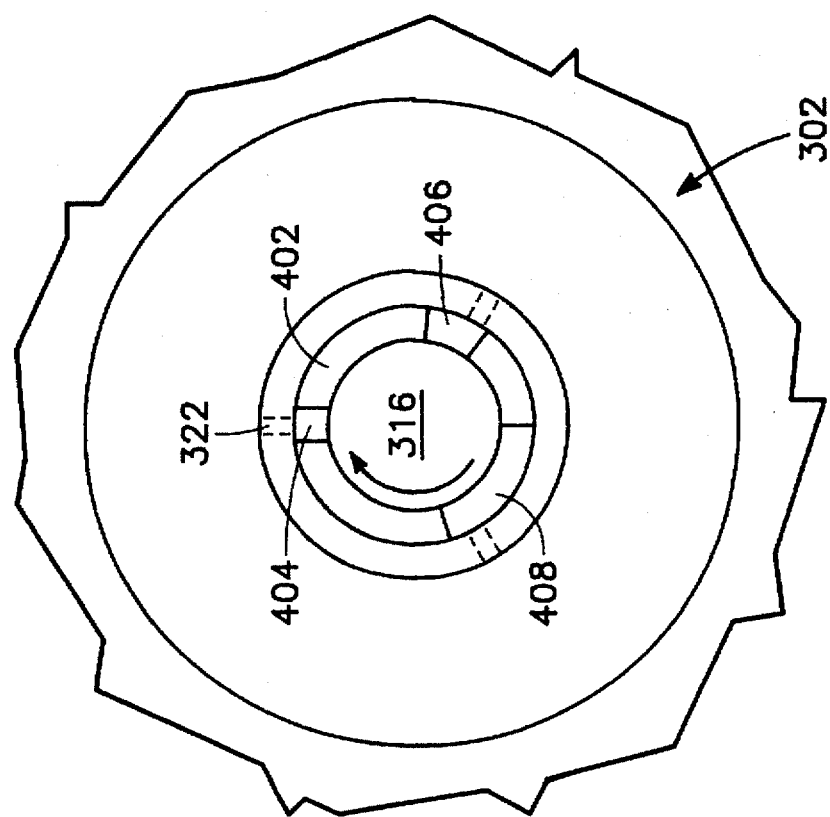
FIG. 19A is a top view of the center member of the gas distribution apparatus according to one version of the embodiments of FIGS. 16A-B, 17, or 18, incorporating an asymmetrical rotatable blocking ring.

Although the above discussion presumed the desired aperture flow rate was the same for each aperture 324, 346, 346', this does not need to be the case. It may be beneficial in some circumstances to have different flow rates from each aperture. For example, it might be advantageous to have a greater flow rate from the inner aperture 324, to help alleviate the previously-described problem related to the depletion of etchant species near the center of the wafer. Varying the flow rate from one aperture to the next is easily accomplished by selecting an appropriate number of holes 322, 344, 344' and hole diameters, as explained above, for each of the affected members 302, 304, 304'. In addition, the aforementioned inserts could be employed to accomplish the desired flow rate variations. The embodiments of FIGS. 16A–B, 17, and 18 also lend themselves to providing an adjustable flow rate from each aperture 324, 346, 346'. One way of realizing this capability would be to incorporate a rotatable annular ring 402, as shown in FIG. 19A, in the central cavity 316 of a center member 302. It is noted that a similar ring would be incorporated in each of the annular cavities and would function in a similar manner, however, to facilitate the explanation of the structure and operation of the aforementioned ring, only the ring 402 installed in the central cavity 316 will be described. This ring 402 abuts the wall of the central cavity 316. In an initial rotational position, as shown in FIG. 19A, slots 404, 406, 408 existing in the ring 402 are aligned with all the holes 322. In this mode, the holes 322 are unblocked and a maximum flow rate is established. As the ring 402 is rotated (in this case in a clockwise direction) into a series of alternate rotational positions, the holes 322 are progressively covered by the ring 402, i.e. one additional hole 322 is covered at each subsequent rotational position. Accordingly, the aperture flow rate is incrementally reduced as more and more of the holes 322 are covered, until a desired rate is achieved. By similarly adjusting the flow rate from each aperture, the overall gas distribution profile can be customized.

Of course, the adjustable flow embodiment of FIG. 19A does result in an asymmetric injection of gas into the manifolds. This might lead to a asymmetric flow from the apertures. In some circumstances, an asymmetric flow pattern could be advantageous, such as when it is desired to compensate for an asymmetric pumping pattern in the chamber. However, where an asymmetric flow from the apertures is not desired, a modified rotatable annular ring 402' can be employed, as shown in FIG. 19B. Here again, only the ring 402' incorporated into the central cavity 316 is shown, but a similar ring can be added to each of the aforementioned annular cavities (if any), as well. This modified ring 402' also abuts the wall of the central cavity 316. In its initial rotational position, as shown in FIG. 19B, slots 404', 406', 408' are aligned with all the holes 322 such that the holes are unblocked and a maximum flow rate is established. As the ring 402' is rotated (in this case in a clockwise direction), an equal portion of each hole 322 is progressively covered by the ring 402'. This gradually reduces the overall aperture flow rate as more of each hole is covered. The ring 402' is rotated until the desired flow rate is achieved. Since an equal portion of each hole 322 is blocked using the ring 402', a symmetric flow pattern into the cavity 316 is maintained. Thus, the embodiment of 19B, would be preferred when such a pattern is desired.

It is noted that a similar flow rate adjustment could be obtained by simply employing flow restricting or blocking inserts in the holes 322, 344, 344'. However, it is believed the use of a rotatable annular ring 402, 402' offers a more convenient method of varying the aperture flow rates, and so is preferred.

Another beneficial modification that could be made to the embodiments of FIGS. 16A–B and 18–19 would involve providing a separate gas inlet to each cavity 316, 340, 340'. Such a modification would allow a different gas or mixture of gasses to be disbursed from each aperture 324, 346, 346'. Also, the gas or gasses could be introduced to the gas distribution apparatus at different pressures, thereby providing yet another way of varying the flow rate from each aperture 324, 346, 346'. FIG. 20 shows how a two-slot embodiment can be modified to provide for the aforementioned separate gas inlets. As can be seen, the central cavity 316 is connected to gas inlet channel 370, similar to the previous embodiments. However, instead of the annular cavity 340 being connected to the channel 370, it is connected to a second gas inlet channel 502. The separate inlet channels 370, 502 allow different gasses (or mixtures of gasses), at different pressures, to be introduced to the central cavity 316 and annular cavity 340, respectively. Thus, the type of gas disbursed from the respective inner and outer apertures 324, 326, as well as its flow rate, can be separately controlled. To prevent any leakage from the annular cavity 340 and outer manifold 342 to the central cavity 316 and inner manifold 320, or vice versa, additional sealing O-rings 504, 506 have been added. The first new O-ring 504 is installed in an annular channel formed in the second annular portion 310 of the center member 302 adjacent the ledge 334 of the intermediate member 304. Of course, the annular channel could alternately be formed in the intermediate member 304, and the O-ring 504 installed therein, if desired. The other new sealing O-ring 506 replaces the compression O-ring of previous embodiments. This new O-ring 506 performs both a sealing function and the previously described retaining function. It is noted that further new gas inlet channels and sealing O-rings would be required for independent feed gas distribution apparatuses having more than two apertures. However, the structure and placement of these new features would be similar to those shown in FIG. 20 for a two-slot embodiment, and so no detailed discussion will be provided herein.

As with the embodiments of FIGS. 7A, C, and E, the present embodiments can include angled slotted apertures to ensure an optimum uniform distribution of etch rate across the surface of the wafer (see earlier discussion). A portion of such an angled aperture is depicted in FIG. 21. For convenience, only the interface between one side of the center member 302 and the intermediate member 304 is shown, although all the apertures of the apparatus could have a similar angled structure. The innermost edge of the lower portion of the intermediate member 304, as well as the adjacent edge of the disk-shaped bottom 314 of the center member 302 are oppositely beveled to create the desired angle. Like previous embodiments, the aperture 324 need not have the angle depicted. Any angle may be employed, either facing inward or outward, as desired. The other apertures 346, 346' in the multiple-slot embodiments of FIGS. 16A–B and 19 could be given similar beveled walls, forming the same or a different angle, or no bevel at all (i.e. a vertical aperture). Again, the choice of angles is dependent on the aforementioned desire to optimize the etch rate across the wafer.

It is noted that the embodiments of FIGS. 16A–B, and 17–21 could also employ a focus ring 278 as discussed in connection with FIG. 8. The focus ring 278 can be used alone, or in combination with the measures discussed above to enhance the uniformity of the etch rate across the surface of the wafer for the present embodiments, such as varying the aperture flow rates, or employing an angled aperture.

The assembly of the above-described gas distribution apparatus can be facilitated by employing a modified structure when ceramic, fused quartz, or similar materials, are employed. In reference to FIG. 22, it has been found that a chamfered edge 602 covering approximately two-thirds of the length of the edge of the inner annular section 326 adjacent the second annular portion 310 of the center member 302 allows for an easier assembly of the interfacing members 302, 304, and a reduce risk of damage. This results because the aforementioned interfacing surfaces between the members 302, 304 are preferably a tight fit. Any angular misalignment between the parts causes jamming during assembly. In the case of hard and brittle materials, such as identified above, this jamming can lead to damage if the parts are forced. However, the chamfered edge 602 creates a tapered lead-in which tends to align the parts as they are assembled, thus alleviating the jamming problem. The remaining non-chamfered portion of the edge 604 provides the necessary interface between the parts to center and align them in respect to one another, as discussed previously. A similar chamfered edge (not shown) is also preferred in the upper portion 348 of the outer member 306 adjacent the outer annular section 336 of the intermediate member 304 for the two-slot embodiment of FIGS. 16A–B, and in the inner annular section 326' of the intermediate member 304' adjacent the outer annular section 336 of intermediate member 304 in the three-slot embodiment of FIG. 18. Similar chamfered edges would be preferred between the additional intermediate sections of gas distribution apparatuses having more than three slotted apertures, as well. Finally, although it is believed due to the relative pliability of a metallic or polymeric gas distribution apparatus that chamfered edges are not necessary to prevent damage, their use are still preferred to make the assembly process easier and to minimize wear.

The embodiments of FIGS. 16A–B and 17 (which incorporate the just-described chamfered edges) has been subjected to extensive testing involving the processing of tens of thousands of wafers. These tested embodiments are currently still in service and continue to exhibit a stable performance with no signs of wear. The testing clearly demonstrates the longer life and lower cost of consumable materials realized in these embodiments of the present invention relative to conventional gas distribution plates currently employed in typical plasma reactor chambers.

As can be imagined, especially with the multiple-slot embodiments of FIGS. 16A–B and 18, substantial portions of the reaction chamber's ceiling will be replaced with the gas distribution apparatus. If the previously identified ceramic, fused quartz, or polymeric materials are used, it would mean the aforementioned portions of the ceiling will not be conductive, and part of the ceiling ground plane.

However, despite this, it has been found that plasma characteristics, such as coupling efficiency, remain unaffected, at least when using a two-slot tested embodiment having an overall diameter of approximately 5.5 inches. Based on the experience gained from the aforementioned tested embodiment, it is believed the non-conductive materials of the gas distribution apparatus do not appear to have any significant effect on the plasma. Thus, even larger diameter apparatuses should be possible without much effect on the plasma.

In some applications it may be desired to use a gas distribution apparatus made from anodized aluminum. If this is the case, and the ceiling of the chamber is also formed of anodized aluminum, it is possible to eliminate the outer member 306 described in connection with the embodiments of FIGS. 16A–B, and 17–22. Instead of employing the outer member, the hole in the chamber lid meant to accommodate the gas distribution apparatus would be modified to take its place. Specifically, the periphery of the hole could be modified to match the stepped configuration of the inner edges of the outer member. The intermediate member (or center member if a single-slot apparatus is employed) would then be installed directly into the modified lid.

Another possible modification to the embodiments of FIGS. 16A–B and 17–22 employing the aforementioned ceramic, fused quartz, or polymeric materials, would involve making the center member, or a portion thereof, conductive. Such a modification would allow the conductive portion of the center member to be used as part of a sensor for conducting plasma performance testing. Accordingly, the probe typically used for this purpose would not be necessary, nor would the associated access ports into the chamber's interior which can affect the performance characteristics of the reactor during normal operations.

While the invention has been described in detail by specific reference to preferred embodiments thereof, it is understood that variations and modifications thereof may be made without departing from the true spirit and scope of the invention.

What is claimed is:

1. A plasma reactor having a vacuum chamber and a gas distribution apparatus, said gas distribution apparatus comprising:

an elongate thin slotted aperture facing the interior of said chamber;

a gas manifold that is in correspondence with said slotted aperture;

a gas inlet cavity;

at least one connecting hole connecting said gas inlet with said manifold for controlling the flow rate of gas from said slotted aperture into the interior of said chamber; and a blocking device capable of at least partially blocking said at least one connecting hole so as to restrict the flow of gas therethrough.

2. The reactor of claim 1 wherein said gas distribution apparatus comprises at least two connecting holes connecting said gas inlet cavity with said manifold, and wherein said blocking device comprises:

an insert disposed in at least one of said connecting holes, said insert being capable of one of (i) decreasing the flow of gas, or (ii) stopping the flow of gas completely.

3. The reactor of claim 1 wherein said gas distribution apparatus comprises at least two connecting holes connecting said gas inlet cavity with said manifold, and wherein said blocking device comprises:

a rotatable ring disposed in said gas inlet cavity which allows the flow of gas through all of said connecting holes in a first rotational position but which progressively blocks the flow of gas through said connecting holes in each one of a series of prescribed subsequent rotational positions of said ring, one additional connecting hole being blocked in each of said subsequent rotational positions.

4. The reactor of claim 1 wherein said gas distribution apparatus comprises at least two connecting holes connecting said gas inlet cavity with said manifold, and wherein said blocking device comprises:

a rotatable ring disposed in said gas inlet cavity which allows the flow of gas through all of said connecting holes in a first rotational position but which progressively and equally blocks the flow of gas through said connecting holes in each one of a series of prescribed subsequent rotational positions of said ring.

5. The reactor of claim 1 wherein said blocking device comprises:

an insert disposed in said at least one connecting hole, said insert being capable of one of (i) decreasing the flow of gas, or (ii) stopping the flow of gas completely within the connecting hole.

6. The reactor of claim 1 wherein said blocking device comprises:

a rotatable ring disposed in said gas inlet cavity which allows the flow of gas through said at least one connecting hole in a first rotational position but which progressively blocks the flow of gas through the connecting hole in each one of a series of prescribed subsequent rotational positions of said ring.

7. A plasma reactor comprising:

a reactor vacuum chamber having a chamber housing, said chamber housing comprising a lid having a ceiling surface and an opening therethrough; and gas distribution apparatus disposed within said opening in said lid, the gas distribution apparatus comprising a center member having a bottom portion which forms an annular gap in conjunction with a portion of said lid adjacent said ceiling surface, said gap comprising a first slotted aperture.

8. The reactor of claim 7 wherein:

said lid and said center member comprise anodized aluminum.

9. A plasma reactor comprising:

a reactor vacuum chamber having a chamber housing, said chamber housing comprising a lid having a ceiling surface and an opening therethrough; and gas distribution apparatus disposed within said opening in said lid, the gas distribution apparatus comprising a center member and at least two annular members disposed between said center member and a periphery of said opening through said lid, wherein a bottom portion of an innermost annular member and a bottom portion of said center member form an annular gap therebetween comprising an inner slotted aperture, and a bottom portion of an outermost annular member and a portion of said lid adjacent said ceiling surface form an annular gap therebetween comprising an outer slotted aperture, and bottom portions of adjacent annular members form an annular gap therebetween comprising an intermediate slotted aperture.

10. The reactor of claim 7 wherein:

said lid, said center member, and said at least two annular members comprise anodized aluminum.

11. A plasma reactor having a vacuum chamber and a gas distribution apparatus, said gas distribution apparatus comprising:

a center member and at least two annular members surrounding said center member, wherein each annular member comprises a centering structure for interfacing with an internally adjacent member and causing said internally adjacent member to be concentric therewith, said centering structure comprising:

a chamfered portion situated such that said internally adjacent member encounters said chamfered portion first during an assembly of the internally adjacent member into the center void of a one of said annular members, said chamfered portion guiding said internally adjacent member into said void without significant interference; and a cylindrical portion sized and situated such that said internally adjacent member interfaces with and is centered by said cylindrical portion after passing through said chamfered portion during said assembly.

12. A plasma reactor having a vacuum chamber and a gas distribution apparatus, said gas distribution apparatus comprising:

a center member and at least two annular members surrounding said center member, wherein at least a portion of said center member which is in correspondence with the interior of the chamber comprises a conductive material and each of said annular members comprises a non-conductive material.

13. The reactor of claim 12 wherein said center member comprises:

means for sensing attributes of a plasma formed within the chamber connected to the conductive portion of said center member.

14. A plasma reactor having a vacuum chamber and a gas distribution apparatus, said gas distribution apparatus comprising:

a plurality of gas supplies each capable of providing a different processing gas at a different pressure;

a plurality of gas inlets each of which is connected to a one of said gas supplies; and a plurality of elongate, thin, slotted apertures facing the interior of said chamber, each of said apertures being in correspondence with a one of said gas inlets so as to direct a flow of processing gas associated with a one of said gas supplies into the chamber.

15. A plasma reactor comprising:

a reactor vacuum chamber having a chamber housing, said chamber housing comprising a lid having a ceiling surface and an opening therethrough; and gas distribution apparatus disposed within said opening in said lid, the gas distribution apparatus comprising a center member and an annular member disposed between said center member and a periphery of said opening through said lid, wherein a bottom portion of the annular member and a bottom portion of said center member form an annular gap therebetween comprising an inner slotted aperture, and a bottom portion of the annular member and a portion of said lid adjacent said ceiling surface form an annular gap therebetween comprising an outer slotted aperture.

16. The reactor of claim 15 wherein:

said lid, said center member, and said annular member comprise anodized aluminum.

17. A plasma reactor having a vacuum chamber and a gas distribution apparatus, said gas distribution apparatus comprising:

a center member and an annular member surrounding said center member, wherein said annular member comprises a centering structure for interfacing with said center member and causing said center member to be concentric therewith, said centering structure comprising:

a chamfered portion situated such that said center member encounters said chamfered portion first during an assembly of the center member into the center void of said annular member, said chamfered portion guiding said center member into said void without significant interference; and a cylindrical portion sized and situated such that said center member interfaces with and is centered by said cylindrical portion after passing through said chamfered portion during said assembly.

18. A plasma reactor having a vacuum chamber and a gas distribution apparatus, said gas distribution apparatus comprising:

a center member and an annular member surrounding said center member, wherein at least a portion of said center member which is in correspondence with the interior of the chamber comprises a conductive material and said annular member comprises a non-conductive material.

* * * * *